(12) United States Patent
Long et al.

(10) Patent No.: US 12,512,360 B2
(45) Date of Patent: Dec. 30, 2025

(54) CHIP TRANSFER METHOD AND ELECTRONIC DEVICE

(71) Applicant: Huawei Technologies Co., Ltd., Shenzhen (CN)

(72) Inventors: Haohui Long, Beijing (CN); Shanshan Wei, Shanghai (CN); Yong She, Shanghai (CN); Jianping Fang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 366 days.

(21) Appl. No.: 18/006,066

(22) PCT Filed: Jul. 20, 2021

(86) PCT No.: PCT/CN2021/107476
§ 371 (c)(1),
(2) Date: Jan. 19, 2023

(87) PCT Pub. No.: WO2022/017402
PCT Pub. Date: Jan. 27, 2022

(65) Prior Publication Data
US 2023/0352334 A1 Nov. 2, 2023

(30) Foreign Application Priority Data
Jul. 24, 2020 (CN) .......................... 202010726049.0

(51) Int. Cl.
*H01L 21/683* (2006.01)
*H01L 25/075* (2006.01)

(52) U.S. Cl.
CPC ...... *H01L 21/6835* (2013.01); *H01L 25/0753* (2013.01); *H01L 2221/68368* (2013.01)

(58) Field of Classification Search
None
See application file for complete search history.

(56) References Cited

U.S. PATENT DOCUMENTS 3,559,855 A * 2/1971 Barnett ............... H01L 21/3043
225/2
3,870,196 A * 3/1975 Hargraves ............ B28D 5/0029
225/103

(Continued)

FOREIGN PATENT DOCUMENTS

CN 110429051 A 11/2019
CN 112038280 A 12/2020

*Primary Examiner* — Fred Tzeng
(74) *Attorney, Agent, or Firm* — Slater Matsil, LLP

(57) ABSTRACT

A chip transfer method includes: first, providing a stretchable layer, where the stretchable layer includes a first cloth layer and a second cloth layer, a plurality of first fibers and a plurality of second fibers located between the first cloth layer and the second cloth layer, and a plurality of intersections exist between the first fiber and the second fiber; sticking the stretchable layer to chips, where the first cloth layer is closer to the chips than the second cloth layer; then, separating a plurality of chips, where the plurality of separated chips are separately connected to the first fiber and the second fiber; respectively disposing, at a plurality of preset locations of the substrate, the plurality of chips stuck to the stretchable layer; and removing the first fiber and the second fiber.

20 Claims, 31 Drawing Sheets

(56) References Cited

U.S. PATENT DOCUMENTS

| | | | |
|---|---|---|---|
| 3,918,150 A * | 11/1975 | Gantley | H01L 21/6836 438/464 |
| 4,140,260 A * | 2/1979 | Gantley | H01L 21/6836 225/93 |
| 4,798,645 A * | 1/1989 | Pak | H01L 21/67132 156/716 |
| 5,359,208 A * | 10/1994 | Katsuki | H10F 55/00 257/434 |
| 5,416,872 A * | 5/1995 | Sizer | G02B 6/421 385/88 |
| 5,923,047 A * | 7/1999 | Chia | H01L 22/32 257/784 |
| 6,139,676 A * | 10/2000 | Fernandez | H01L 21/67132 156/707 |
| 6,277,711 B1 * | 8/2001 | Wu | H01L 24/83 438/464 |
| 7,238,593 B2 * | 7/2007 | Medding | G07F 11/1657 438/464 |
| 8,558,371 B2 * | 10/2013 | Hong | H01L 23/10 257/E23.128 |
| 9,177,863 B2 * | 11/2015 | Gillingham | H01L 25/50 |
| 10,170,443 B1 * | 1/2019 | Horibe | H01L 24/98 |
| 10,269,760 B2 * | 4/2019 | Lin | H01L 24/95 |
| 10,991,597 B2 * | 4/2021 | Lee | H01L 21/6836 |
| 11,257,785 B2 * | 2/2022 | Zhang | H01L 25/0652 |
| 11,362,063 B2 * | 6/2022 | Xing | H01L 25/0657 |
| 12,230,528 B2 * | 2/2025 | Hwang | H01L 25/50 |
| 2002/0050059 A1 * | 5/2002 | Waeckerle | H01L 21/68707 29/832 |
| 2004/0077125 A1 * | 4/2004 | Waeckerle | H01L 21/68707 438/106 |
| 2006/0000082 A1 * | 1/2006 | Vischer | H01L 21/67144 29/832 |
| 2007/0013017 A1 * | 1/2007 | Badehi | G02B 6/3897 438/69 |
| 2009/0249604 A1 * | 10/2009 | Nakamura | H01L 21/6838 29/762 |
| 2010/0244284 A1 * | 9/2010 | Yang | H01L 25/50 257/E23.116 |
| 2012/0252161 A1 * | 10/2012 | Ng | H01L 21/67144 438/107 |
| 2017/0194304 A1 | 7/2017 | Takeya et al. | |

* cited by examiner

CHIP TRANSFER METHOD AND ELECTRONIC DEVICE

CROSS-REFERENCE TO RELATED APPLICATIONS

This application is a national stage of International Application No. PCT/CN2021/107476, filed on Jul. 20, 2021, which claims priority to Chinese Patent Application No. 202010726049.0, filed on Jul. 24, 2020. Both of the aforementioned applications are hereby incorporated by reference in their entireties.

TECHNICAL FIELD

This application relates to the field of micro light-emitting diode display technologies, and in particular, to a chip transfer method and an electronic device.

BACKGROUND

With development of display technologies, a micro-component manufacturing process becomes a development trend of a display panel, for example, a micro (micro) light-emitting diode (light-emitting diode, LED) technology. The micro LED technology is to form micro LEDs at a micrometer level on a donor (donor) substrate, for example, a wafer (wafer), then, transfer the micro LEDs on the donor substrate to a receptor (receptor) substrate, for example, a circuit board, and arrange the micro LEDs in an array. Each micro LED may be independently driven to be lit up as a pixel (pixel), so that a display can present an image with higher exquisiteness and stronger contrast. The micro LED inherits features such as high efficiency, high brightness, high reliability, and fast response time of an LED, has a self-luminous feature, and has advantages such as energy saving, a simple structure, and a small and thin size. In addition, compared with an organic light-emitting diode (organic light-emitting diode, OLED) display, a color of a micro LED display is easier to be accurately adjusted, and the micro LED display has a longer luminous lifespan and higher brightness, and has advantages such as better material stability, a longer lifespan, and no image burn-in.

Currently, a massively parallel pick and place (massively parallel pick and place) technology may be used to pick the micro LEDs on the donor substrate in batches by using a transfer head, and transfer the micro LEDs to the substrate. Because the transfer head needs to move repeatedly between the donor substrate and the donor substrate, it needs to take some time to pick and place the micro LEDs in each movement process. Therefore, when a display with a high resolution is manufactured, production efficiency is too low because of a large quantity of micro LEDs that need to be transferred, and consequently cannot meet expectations of a market and manufacturing costs.

SUMMARY

This application provides a chip transfer method and an electronic device, to resolve a problem of low efficiency of a mass transfer micro LED technology.

To achieve the foregoing objective, the following technical solutions are used in this application.

According to an aspect of this application, a chip transfer method is provided, to transfer chips in a motherboard to a substrate. The method includes: first, providing a stretchable layer, where the stretchable layer may include a plurality of first fibers and a plurality of second fibers, a first cloth layer and a second cloth layer that are stacked, the first fiber and the second fiber intersect between the first cloth layer and the second cloth layer, and a plurality of intersections exist between the first fiber and the second fiber, where a first spacing H1 is controlled to exist between two adjacent intersections, and a second spacing H2 is controlled to exist between the first cloth layer and the second cloth layer; next, sticking the stretchable layer to the chips, where at the stretchable layer, the first cloth layer is close to the chips, and the second cloth layer is away from the chips; then, separating a plurality of chips, where the plurality of separated chips are separately connected to the first fiber and the second fiber; next, respectively disposing, at a plurality of preset locations of the substrate, the plurality of chips stuck to the stretchable layer; and finally, removing the first fiber and the second fiber.

In conclusion, in the chip transfer method provided in this application, the stretchable layer may be stuck to each chip in the motherboard. The second spacing H2 exists between the first cloth layer and the second cloth layer, so that the first fiber and the second fiber at the stretchable layer existing before stretching are wavy. In addition, the first spacing H1 between two adjacent intersections of the first fiber and the second fiber is controlled, so that the first spacing H1 can be the same as a spacing between two chips on the motherboard. In this case, after the stretchable layer existing before stretching is stuck to the plurality of chips on the motherboard, an intersection of the first fiber and the second fiber is stuck to a location at which a chip on the motherboard is located. Based on this, after the stretchable layer is stuck to the motherboard, the plurality of chips in the motherboard may be separated. Next, the plurality of chips at the stretchable layer may be disposed at the preset locations on the substrate. Then, the first fiber and the second fiber are removed, to complete mass transfer of the chips. It can be learned from the foregoing descriptions that, in the chip transfer method provided in this application, only the stretchable layer needs to be stuck to the plurality of chips on the motherboard. Next, the plurality of chips at the stretchable layer are disposed on the substrate. In this way, most or even all chips on the same motherboard can be transferred to the substrate at a time. Therefore, in a chip transfer process, a transfer head does not need to reciprocate between the motherboard and the substrate, to improve mass transfer efficiency of the chips.

Optionally, the providing a stretchable layer includes intersecting a plurality of first warp threads and a plurality of first weft threads to form the first cloth layer, where a spacing between two adjacent first warp threads is the same as the first spacing H1, and a spacing between two adjacent first weft threads is the same as the first spacing H1. In addition, intersecting a plurality of second warp threads and a plurality of second weft threads to form the second cloth layer, where a spacing between two adjacent second warp threads is the same as the first spacing H1, a spacing between two adjacent second weft threads is the same as the first spacing H1, a vertical projection of the second warp thread at the first cloth layer is located between two adjacent first warp threads, and a vertical projection of the second weft thread at the first cloth layer is located between two adjacent second weft threads. In this way, locations of the first weft thread and the first warp thread that intersect at the first cloth layer, and the second weft thread and the second warp thread that intersect at the second cloth layer at the stretchable layer may be controlled, so that the first spacing H1 can be the same as a spacing between two chips on the motherboard.

Optionally, the first fiber intersects with the first warp thread and the second warp thread; and the second fiber intersects with the first weft thread and the second weft thread. In this way, both the first fiber and the second fiber may be intersected with the first cloth layer and the second cloth layer.

Optionally, the sticking the stretchable layer to the chips includes: sticking an intersection to a chip in the motherboard in alignment. Because the location of the intersection can be controlled, the chips on the motherboard can be stuck based on a requirement.

Optionally, an initial spacing Ha exists between two adjacent chips in the motherboard, and Ha=H1. In this way, the plurality of intersections at the stretchable layer and the plurality of chips in the motherboard may be stuck in one-to-one alignment, so that all chips on the motherboard can be transferred.

Optionally, the sticking an intersection to a chip in the motherboard in alignment includes: coating an adhesive layer at the intersection at the first cloth layer; and then, sticking a surface of a side of the stretchable layer coated with an adhesive layer to the motherboard, so that a vertical projection of an intersection on the motherboard overlaps a chip in the motherboard. In this way, an adhesive layer may be formed at the first cloth layer, and the stretchable layer is stuck on the motherboard through the adhesive layer.

Optionally, the sticking an intersection to a chip in the motherboard in alignment includes: dispensing adhesive on the motherboard to form a plurality of adhesive layers, where a vertical projection of an adhesive layer on the motherboard overlaps a chip in the motherboard; and then, sticking, to the motherboard through a plurality of adhesive layer arrays, a surface of a side on which the first cloth layer is located, so that a vertical projection of an intersection on the motherboard overlaps an adhesive layer. An adhesive layer array is formed by dispensing adhesive at a location of each chip on the motherboard, and the stretchable layer is stuck on the motherboard through the adhesive layer array.

Optionally, the sticking an intersection to a chip in the motherboard in alignment includes: coating a colloidal material layer on the motherboard, and patterning the colloidal material layer, so that a plurality of adhesive layers are formed on the motherboard, where a vertical projection of an adhesive layer on the motherboard overlaps a chip in the motherboard; and then, sticking, to the motherboard through the adhesive layer, a surface of a side on which the first cloth layer is located, so that a vertical projection of an intersection on the motherboard overlaps an adhesive layer. In this way, the plurality of adhesive layers on the motherboard may be formed in a same mask exposure process, and therefore efficiency of a manufacturing process can be improved.

Optionally, the motherboard includes a substrate configured to carry the chips, and the sticking the stretchable layer to the chips includes: sticking the stretchable layer on a surface of a side that is of the substrate and that is away from the chips. In this way, a case in which surfaces of a side on which a first electrode and a second electrode in the chips are located are in contact with the adhesive layer, and therefore performance of the chips is affected can be avoided.

Optionally, the chips each include a first electrode and a second electrode. The respectively disposing, at a plurality of preset locations of the substrate, the plurality of chips at the stretchable layer includes: placing, at a preset location by using a flip-chip process, a first electrode and a second electrode of a chip close to the substrate, and welding the first electrode and the second electrode of the chip to the substrate. The flip-chip process may enable the first electrode and the second electrode of the chip to be directly welded to the substrate, so that efficiency of transmitting an electrical signal to the first electrode and the second electrode can be improved.

Optionally, after the separating a plurality of chips, and before the respectively disposing, at a plurality of preset locations of the substrate, the plurality of chips at the stretchable layer, the method further includes: stretching the first fiber and the second fiber, so that a third spacing H3 exists between two adjacent chips on the first fiber and the second fiber, where a welding spacing Hb exists between two adjacent preset locations on the substrate, and H3=Hb. In this way, all chips at the stretchable layer can be transferred to the substrate.

Optionally, that a spacing between two adjacent first warp threads is the same as the first spacing H1, and a spacing between two adjacent first weft threads is the same as the first spacing H1 includes: disposing a plurality of first locating pins around the motherboard; and disposing a first locating pin between every two adjacent first warp threads, where the first locating pin is in contact with two adjacent first warp threads, the first locating pin has a first geometric length L1, and L1=H1; and disposing a plurality of second locating pins around the motherboard; and disposing a second locating pin between every two adjacent first weft threads, where the second locating pin is in contact with two adjacent first weft threads, the second locating pin has a second geometric length L2, and L2=H1, where a direction of the first geometric length L1 of the first locating pin is perpendicular to each of two adjacent first warp threads, and a direction of the second geometric length L2 of the second locating pin is perpendicular to each of two adjacent first weft threads. In this way, because the first locating pin is disposed between two adjacent first warp threads and is in contact with two adjacent first warp threads, a spacing between two adjacent first warp threads can be controlled by setting the first geometric length L1 of the first locating pin, so that the spacing between two adjacent first warp threads is the same as the first spacing H1. In addition, a spacing between two adjacent first weft threads can be controlled by setting the second geometric length L2 of the second locating pin, so that the spacing between two adjacent first weft threads is the same as the first spacing H1. The direction of the second geometric length L2 of the second locating pin is perpendicular to each of two adjacent first weft threads.

Optionally, the stretching the first fiber and the second fiber, so that a third spacing H3 exists between two adjacent chips on the first fiber and the second fiber includes: stretching the first fiber and the second fiber; next, turning over a plurality of first locating pins by 90°, and disposing a first locating pin between every two adjacent second fibers, where the first locating pin is in contact with two adjacent second fibers, the first locating pin has a first geometric width B1, and B1=H3; and then, turning over a plurality of second locating pins by 90°, and disposing a second locating pin between every two adjacent first fibers, where the second locating pin is in contact with two adjacent first fibers, the second locating pin has a second geometric width B2, and B2=H3, where a direction of the first geometric width B1 of the first locating pin is perpendicular to each of two adjacent second fibers, and a direction of the second geometric width B2 of the second locating pin is perpendicular to each of two adjacent first fibers. It can be learned from the foregoing description that the first locating pin is originally disposed between two adjacent first warp threads, and the first warp thread and the stretched second fiber are disposed in a same direction. Therefore, after the first warp thread is removed, each first locating pin that turns over by 90° may be disposed between every two adjacent second fibers and in contact with two adjacent second fibers. Similarly, the second locating pin is originally disposed between two adjacent first weft threads, and the first weft thread and the stretched first fiber are disposed in a same direction. Therefore, after the first weft thread is removed, each second locating pin that turns over by 90° may be disposed between every two adjacent first fibers and in contact with two adjacent first fibers. Based on this, by using the first locating pin, the first spacing H1 between two adjacent first warp threads may be controlled, and the third spacing H3 between two adjacent second fibers may be further controlled. By using the second locating pin, the first spacing H1 between two adjacent first weft threads may be controlled, and the third spacing H3 between two adjacent first fibers may be further controlled. In this way, there is no need to additionally add a locating pin when locating the first fiber and the second fiber, so that a quantity of locating pins can be reduced, and a locating process can be simplified.

Optionally, the second spacing H2 and the welding spacing Hb meet a condition that H2=Hb/2. In this way, before the first fiber and the second fiber are stretched, the first fiber and the second fiber are wavy, and a height of the wavy arch is the second spacing H2. In a process of stretching the first fiber and the second fiber, the first fiber and the second fiber are stretched from a wavy shape to a linear shape. When elastic deformation amounts of the first fiber and the second fiber are small, the third spacing H3 between two adjacent chips on the first fiber and the second fiber may be approximately the same as twice the second spacing H2. In this way, after the first fiber and the second fiber are stretched, the third spacing H3 between two adjacent chips on the first fiber and the second fiber may be the same or approximately the same as the welding spacing Hb between two adjacent preset locations on the substrate.

Optionally, the motherboard includes a substrate configured to carry the chips, and the substrate has a plurality of first alignment marks. Before the sticking the stretchable layer to the chips, the method further includes: overlapping a location of a first warp thread or a first weft thread at the stretchable layer to at least one first alignment mark. In this way, the stretchable layer is aligned with the motherboard, to ensure that a vertical projection of an intersection on the motherboard is located at a location of a chip on the motherboard.

Optionally, the substrate has at least one second alignment mark. Before the respectively disposing, at a plurality of preset locations of the substrate, the plurality of chips at the stretchable layer, the method further includes: controlling a chip on the first fiber and the second fiber to overlap a second alignment mark. Therefore, it can be ensured that each chip is in a one-to-one correspondence with a preset location of the substrate.

Optionally, materials of the first warp thread and the first weft thread, and the second warp thread and the second weft thread include a first material, materials of the first fiber and the second fiber include a second material; and the first material and the second material are different. Removing at least a part between two adjacent intersections at the first cloth layer includes: placing the stretchable layer stuck to the chips into a first solvent used to dissolve the first material. In this way, under the action of the first solvent, the materials of the first warp thread and the first weft thread, and the second warp thread and the second weft thread that are formed by the first material may be dissolved, but the first fiber and the second fiber that are made of the second material may be insoluble in the first solvent.

Optionally, removing at least a part between two adjacent intersections at the first cloth layer includes: cutting, by using a laser, a part that is in the first warp thread and that is located between two adjacent intersections, and a part that is in the first weft thread and that is located between two adjacent intersections. Required lines can be selectively cut by setting a wavelength of the laser.

Optionally, after the separating a plurality of chips, and before the stretching the first fiber and the second fiber, the method further includes: removing the second warp thread and the second weft thread, so that both the first cloth layer and the second cloth layer can be removed.

Optionally, the separating a plurality of chips includes cutting the motherboard, to separate the plurality of chips. In this case, the motherboard may be a wafer, so that a plurality of chips are formed on a substrate of the wafer at a time by using a wafer preparation method.

Optionally, the removing the first fiber and the second fiber includes: separating the adhesive layer from the chips by using a laser debonding process, and extracting the first fiber and the second fiber. The adhesive layer is irradiated by using a laser, to release stickiness of the adhesive layer, so that the first fiber and the second fiber are only placed above the chips and are not stuck to the chips, and then the first fiber and the second fiber are extracted, to remove the first fiber and the second fiber.

According to another aspect of this application, an electronic device is provided, and includes a display. The display is prepared by using any chip transfer method described above. The electronic device has a same technical effect as the chip transfer method provided in the foregoing embodiment, and details are not described herein again.

REFERENCE NUMERALS

Figure 1A:
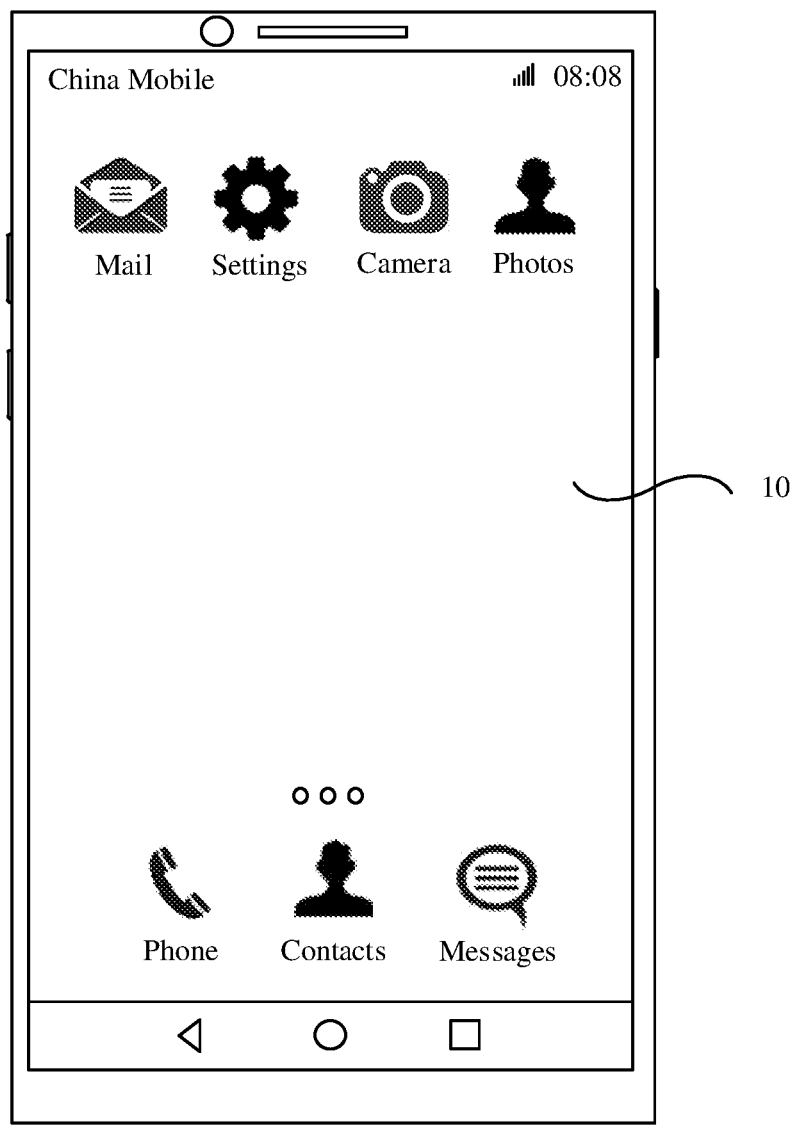
FIG. 1A is a schematic diagram of a structure of an electronic device according to an embodiment of this application.

01: Electronic device; 10: Micro LED display; 11: Middle frame; 12: Housing; 13: Battery; 101: Micro LED chip; 102: Pixel unit; 20: Substrate; 201: Pixel drive circuit; 100: Substrate; 110: First electrode; 120: Second electrode; 130: Light-emitting layer; 140: Epitaxial layer; 21: Motherboard; 30: Stretchable layer; 31: First cloth layer; 32: Second cloth layer; 301: First fiber; 302: Second fiber; 311: First weft thread; 312: First warp thread; 321: Second weft thread; 322: Second warp thread; 41: First locating pin; 42: Second locating pin; 300: Intersection; 51: First alignment mark; 52: Second alignment mark; 60: Adhesive layer; 61: Colloidal material layer; 70: Preset location.

DETAILED DESCRIPTION OF ILLUSTRATIVE EMBODIMENTS

The following describes technical solutions in embodiments of this application with reference to accompanying drawings in embodiments of this application. It is clear that the described embodiments are merely a part rather than all of embodiments of this application.

Terms such as "first" and "second" mentioned below are merely intended for a purpose of description, and shall not be understood as an indication or implication of relative importance or implicit indication of a quantity of indicated technical features. Therefore, a feature limited by "first" or "second" may explicitly or implicitly include one or more features. In the descriptions of this application, unless otherwise stated, "a plurality of" means two or more.

In addition, in embodiments of this application, orientation terms such as "up", "down", "horizontal" and "vertical" may be defined by, but are not limited to, orientations of components schematically placed in the accompanying drawings. It should be understood that these orientation terms may be relative concepts, are used for description and clarification of "relative to", and may be changed accordingly based on changes in placement orientations of the components in the accompanying drawing.

In this application, it should be noted that a term "connection" should be understood in a broad sense unless otherwise expressly specified and limited. For example, the "connection" may be a fixed connection, may be a detachable connection, may be an integral connection; may be a direct connection, or may be an indirect connection implemented by using a medium. In addition, the term "electrical connection" may be a direct electrical connection, or may be an indirect electrical connection through an intermediate medium.

Embodiments of this application provide a chip transfer method, which may be used to manufacture an electronic device having a display function. The electronic device may be applied to various communications systems or communications protocols, such as a global system for mobile communications (global system for mobile communications, GSM), a code division multiple access (code division multiple access, CDMA) system, wideband code division multiple access (wideband code division multiple access, WCDMA), a general packet radio service (general packet radio service, GPRS), and long term evolution (long term evolution, LTE). The electronic device may include an electronic device that has a display function, such as a mobile phone (mobile phone), a tablet computer (pad), a television, an intelligent wearable product (for example, a smartwatch or a smart band), a virtual reality (virtual reality, VR) terminal device, and an augmented reality (augmented reality AR) terminal device. A specific form of the electronic device is not specially limited in embodiments of this application. For ease of description, an example in which an electronic device 01 is a mobile phone shown in FIG. 1A is used below for description.

Figure 1B:
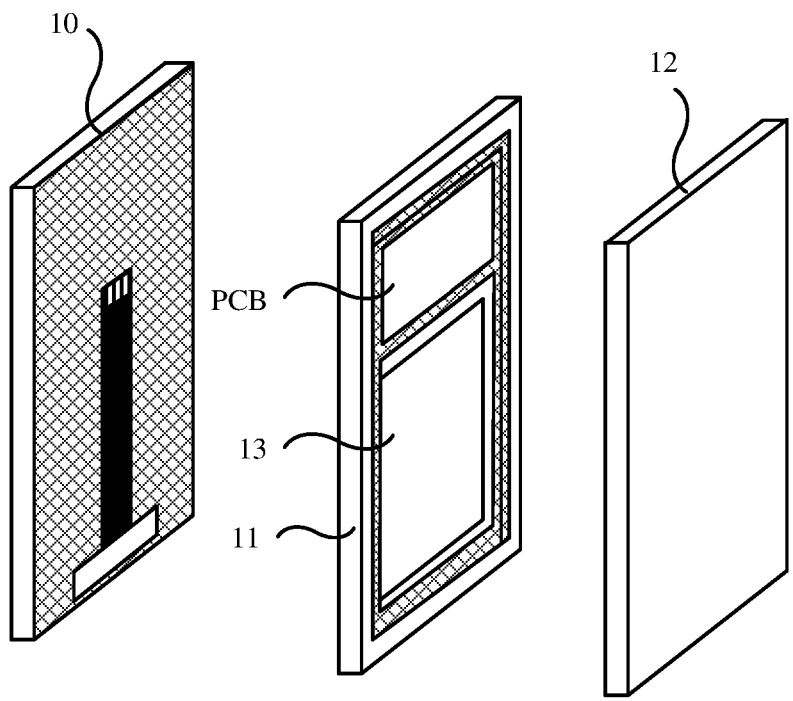
FIG. 1B is a schematic diagram of an exploded structure of the electronic device shown in FIG. 1A.

The electronic device 01 mainly includes a micro (micro) LED display (display panel, DP) 10 shown in FIG. 1A, and a middle frame 11 and a housing 12 shown in FIG. 1B. The micro LED display 10 and the housing 12 are respectively located on two sides of the middle frame 11, and are connected to the middle frame 11. The middle frame 11 may be configured to carry the micro LED display 10. In addition, the electronic device 01 may further include a printed circuit board (printed circuit board, PCB) and a battery 13 that are disposed on a surface of a side that is of the middle frame 11 and that faces the housing 12. The housing 12 is connected to the middle frame 11 to form an accommodation cavity configured to accommodate electronic components such as the PCB and the battery. This can avoid impact on performance of the electronic components because of entering of external water vapor and dust into the accommodation cavity.

Figure 1C:
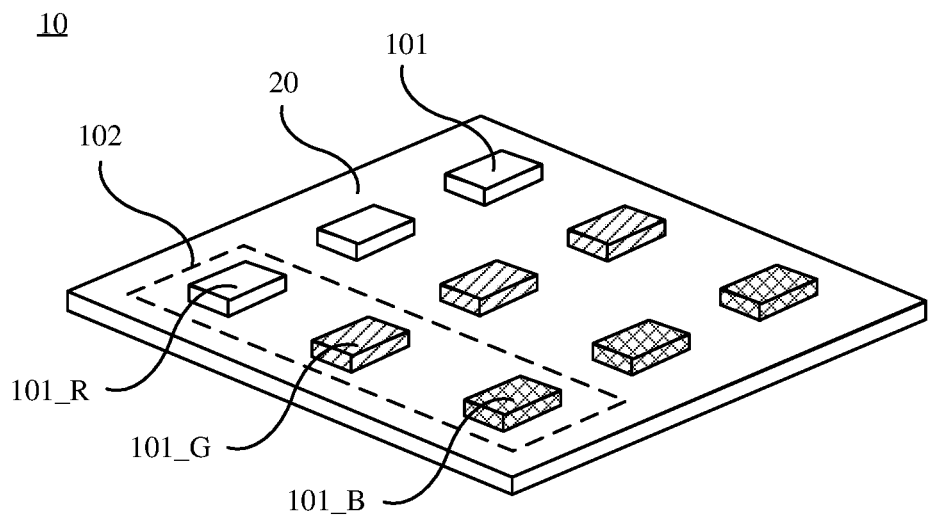
FIG. 1C is a schematic diagram of an arrangement manner of micro LED chips in the display in FIG. 1B.

The micro LED display 10 has an active area (active area, AA). The AA is used to display an image, and an area around the AA is used to dispose a drive circuit. A plurality of micro (micro) LED chips 101 (micro LED chip for short below) shown in FIG. 1C are disposed in the AA. Each micro LED chip 101 may be used as a pixel (pixel) of the micro LED display 10, and is separately driven to emit light. Based on this, a plurality of adjacent micro LED chips that are respectively configured to emit light of three primary colors, for example, a micro LED chip 101_R that emits red light, a micro LED chip 101_G that emits green light, and a micro LED chip 101_B that emits blue light may form a pixel unit 102.

In this case, the micro LED chip 101_R that emits the red light may be used as a red pixel, the micro LED chip 101_G that emits the green light may be used as a green pixel, and the micro LED chip 101_B that emits the blue light may be used as a blue pixel. In addition, in the AA, the pixel unit 102 may be used as a repetition unit for pixel arrangement.

It should be noted that, in FIG. 1C, an example in which a pixel arrangement manner of the micro LED display 10 is that the red pixel (micro LED chip 101_R), the green pixel (micro LED chip 101_G), and the blue pixel (micro LED chip 101_B) in a same pixel unit 102 are sequentially located in a same row and are equal in area is used for description. An arrangement manner of the pixels in the red, green, and blue primary colors may be determined based on a requirement. This is not limited in this application. For example, the pixel arrangement manner of the micro LED display 10 may alternatively be a Pentile pixel arrangement manner (which may also be referred to as P arrangement) in which areas of the red pixel, blue pixel, and green pixel are unequal, an RGB-Delta pixel arrangement manner (which may also be referred to as D arrangement), or the like.

Figure 1D:
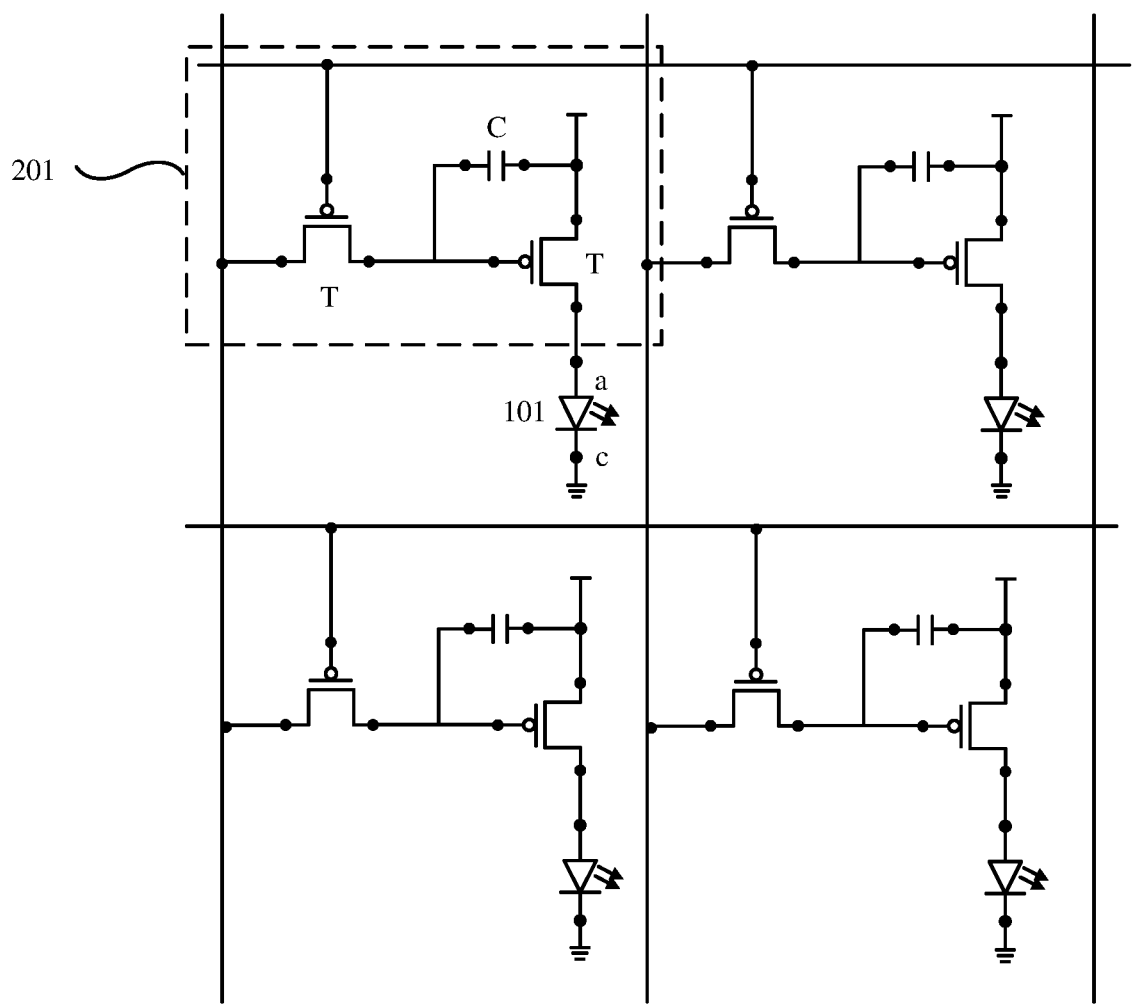
FIG. 1D is a schematic diagram of a structure of a pixel drive circuit disposed on the substrate in FIG. 1C.

To separately drive each micro LED chip 101 in the micro LED display 10, the micro LED display 10 further includes a substrate 20 shown in FIG. 1C. The substrate 20 includes a pixel drive circuit 201 arranged in an array as shown in FIG. 1D. Therefore, the substrate 20 may also be referred to as an array substrate (array substrate). The pixel drive circuit 201 may include a plurality of transistors T and at least one capacitor C. FIG. 1D is described by using an example in which the pixel drive circuit 201 is of a 2T1C structure, that is, includes two transistors, for example, thin film transistors (thin film transistor, TFT), for example, T1 and T2, and a capacitor C.

Figure 2A:
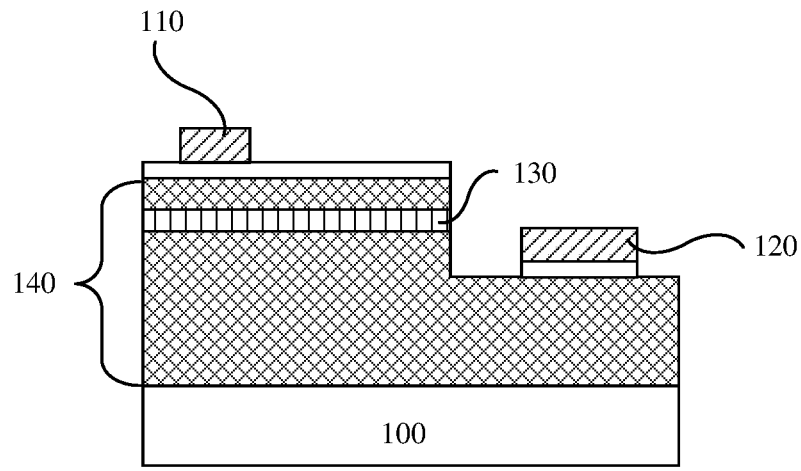
FIG. 2A is a schematic diagram of a structure of the micro LED chips in FIG. 1C.

In this case, a pixel drive circuit 201 may be electrically connected to a first electrode 110 of a micro LED chip 101 shown in FIG. 2A, for example, an anode (anode, a), and a second electrode 120, for example, a cathode (cathode, c) in FIG. 1D. In this way, a voltage may be separately applied to the first electrode 110 and the second electrode 120 of each micro LED chip 101 through the pixel drive circuit 201, and a current flowing through a light-emitting layer 130 (as shown in FIG. 2A) in the micro LED chip 101 is controlled. Therefore, a quantity of photons excited from the light-emitting layer 130 can be controlled, to control brightness of the micro LED chip 101.

Figure 2B:
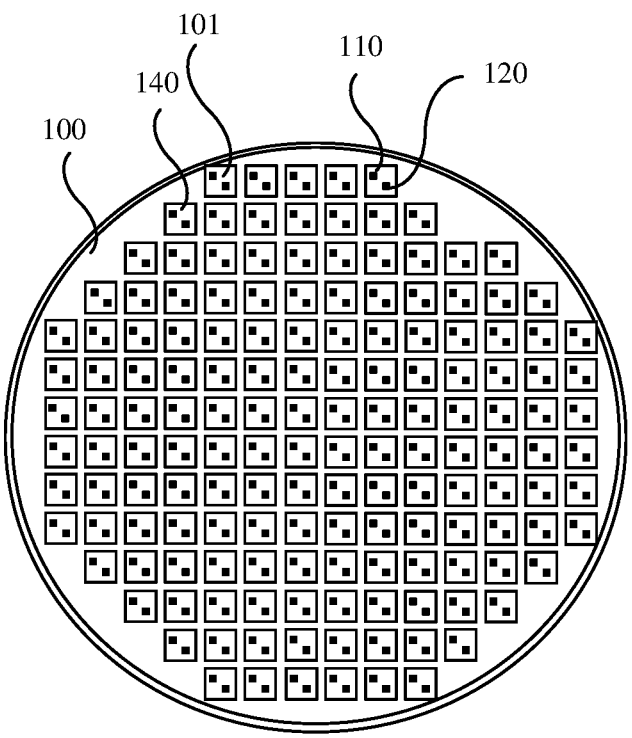
FIG. 2B is a schematic diagram of a structure of a motherboard having the micro LED chips in FIG. 2A.

A manufacturing process of the micro LED chip 101 may be as follows: As shown in FIG. 2B, an epitaxial layer 140 (including the light-emitting layer 130) shown in FIG. 2A is manufactured on a substrate 100 of a motherboard 21, for example, a wafer (wafer). Next, the first electrode 110 and the second electrode 120 are manufactured on the epitaxial layer 140. Then, the motherboard 21 may be cut to obtain a plurality of micro LED chips 101, to separate the plurality of LED chips 101.

It should be noted that a material of the substrate 100 is not limited in this application, and may be a sapphire, glass, a silicon wafer, an organic matter, or the like. In addition, the foregoing description is provided by using an example in which the motherboard 21 is a wafer. In some other embodiments of this application, the motherboard 21 may alternatively be a carrier board configured to carry a plurality of chips 101. In this case, when the plurality of micro LED chips 101 on the carrier board need to be separated, the plurality of micro LED chips 101 only need to be detached from the carrier board, and therefore the carrier board does not need to be cut. For ease of description, an example in which the motherboard 21 is a wafer is used below for description.

Next, to manufacture the micro LED display 10, the cut micro LED chip 101 may be transferred to the substrate 20 having the pixel drive circuit 201, and the first electrode 110 and the second electrode 120 of the micro LED chip 101 are electrically connected to the pixel drive circuit 201. Based on this, in a process of transferring the micro LED display 10, the motherboard 21 may be used as a substrate for providing the micro LED chip 101, and the array substrate having the pixel drive circuit 201 may be used as the substrate 20 for receiving the micro LED chip 101.

Figure 3A:
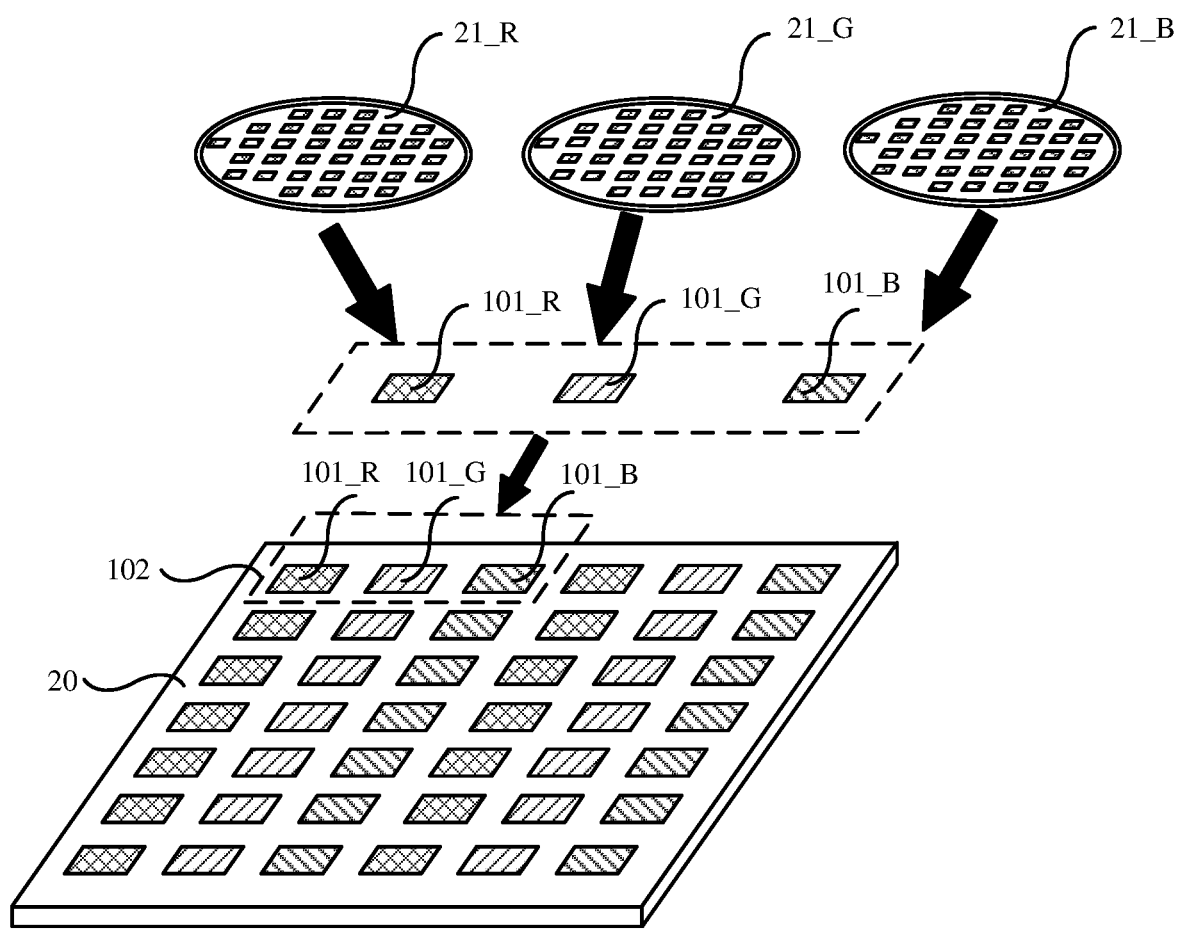
FIG. 3A is a schematic diagram of a chip transfer method according to an embodiment of this application.

In the process of manufacturing the micro LED chip 101, materials of light-emitting layers 130 of a plurality of micro LED chips 101 on a same motherboard 21 are the same. Therefore, light emitted by the plurality of micro LED chips 101 on the same motherboard 21 is also the same. Based on this, in some embodiments of this application, as shown in FIG. 3A, a motherboard 21_R on which the micro LED chip 11_R emitting the red light is manufactured, a motherboard 21_G on which the micro LED chip 101_G emitting the green light is manufactured, and a motherboard 21_B on which the micro LED chip 101_B emitting the blue light is manufactured may be separately separated. Next, a plurality of micro LED chips 101_R, a plurality of micro LED chips 101_G, and a plurality of micro LED chips 101_B are sequentially transferred to a same substrate 20.

Figure 3B:
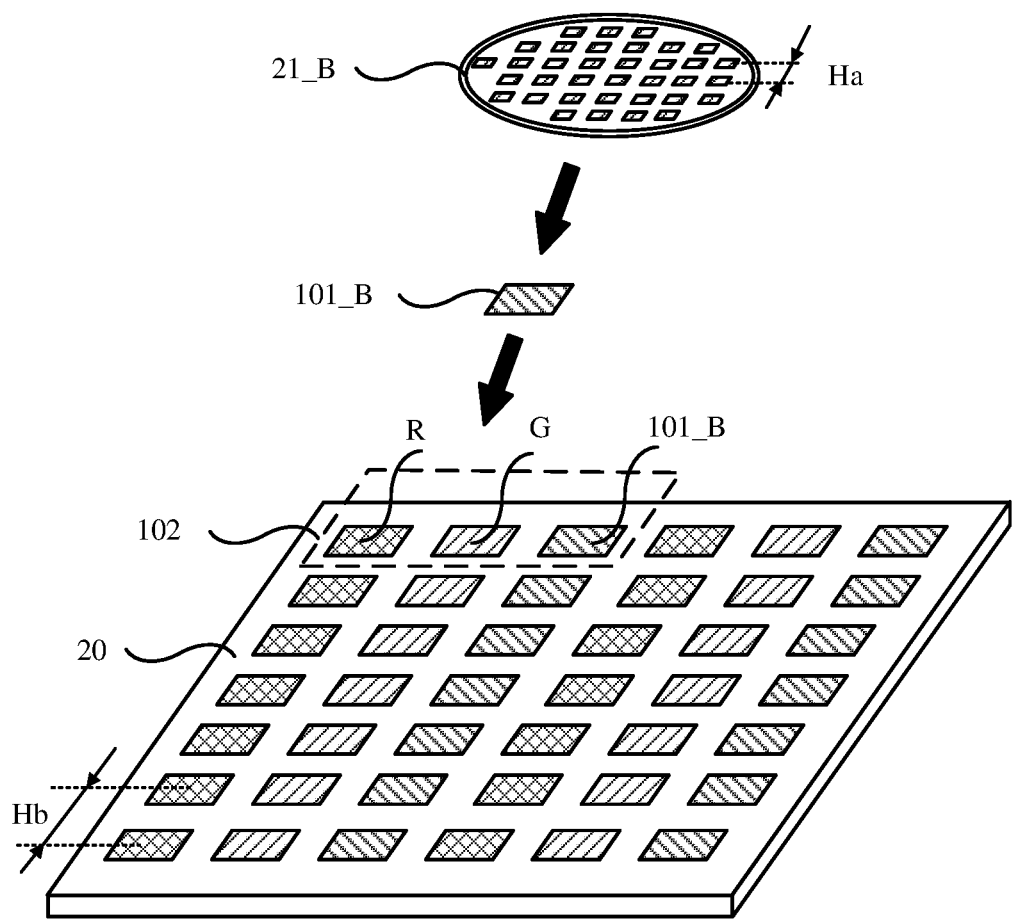
FIG. 3B is a schematic diagram of another chip transfer method according to an embodiment of this application.

Alternatively, in some other embodiments of this application, as shown in FIG. 3B, the motherboard 21 on which the micro LED chip 101_B emitting the blue light is manufactured may be separated, and the motherboard 21 is transferred to the substrate 20. Next, a micro LED chip 101_B is selected from a same pixel unit 102 on the substrate 20, and a light-emitting surface of the micro LED chip 101_B is coated with a first fluorescent layer (not shown in the figure). The first fluorescent layer may emit red light under excitation of blue light. In addition, another micro LED chip 101_B is selected, and a light-emitting surface of the micro LED chip 101_B is coated with a second fluorescent layer (not shown in the figure). The second fluorescent layer may emit green light under excitation of blue light. In addition, a surface of still another micro LED chip 101_B is no longer coated with a fluorescent layer, so that the micro LED chip 101_B still emits blue light. Therefore, display of the three primary colors is implemented.

Alternatively, in some other embodiments of this application, the motherboard 21 on which the micro LED chip 101 emitting ultraviolet light is manufactured may be separated, and the motherboard 21 is transferred to the substrate 20. Next, light-emitting surfaces of three micro LED chips 101 that are located in a same pixel unit 102 on the substrate 20 are separately coated with different fluorescent layers, so that the different fluorescent layers can separately emit red light, green light, and blue light under excitation of the ultraviolet light, to implement display of the three primary colors.

For example, in a batch transfer manner of the micro LED chips shown in FIG. 3B, an initial spacing Ha exists between two adjacent micro LED chips in the motherboard 21. After the micro LED chips in the motherboard 21 are transferred to the substrate 20, a welding spacing Hb exists between two adjacent preset locations on the substrate 20 for welding the micro LED chips 101, and Hb>Ha.

It should be noted that the initial spacing Ha between two adjacent micro LED chips 101 in the motherboard 21 refers to a preset distance between respective centers of the two adjacent micro LED chips 101 in the motherboard 21. Alternatively, when the motherboard 21 is a wafer, within a range allowed by precision of a wafer manufacturing process, the initial spacing Ha between two adjacent micro LED chips 101 in the motherboard 21 may be a distance from a point within a specific range from a center of a micro LED chip 101 in the motherboard 21 to a point within a specific range from a center of another micro LED chip 101 adjacent to the micro LED chip 101.

In addition, the welding spacing Hb between two adjacent preset locations on the substrate 20 refers to a preset distance between respective centers of two adjacent micro LED chips 101 after the micro LED chips 101 are expected to be welded to the substrate 20. Alternatively, within a range allowed by welding alignment precision, the welding spacing Hb between two adjacent preset locations may be a distance from a point within a specific range from a center of a micro LED chip 101 to a point within a specific range from a center of another micro LED chip 101 adjacent to the micro LED chip 101 after the micro LED chips 101 are welded to the substrate 20.

For ease of description, in the following embodiments of this application, an example in which a spacing between any two adjacent micro LED chips in a horizontal direction or a vertical direction in the motherboard 21 is the initial spacing Ha, and a spacing between any adjacent preset locations in a horizontal direction or a vertical direction on the substrate 20 is the welding spacing Hb is used for description.

Figure 4:
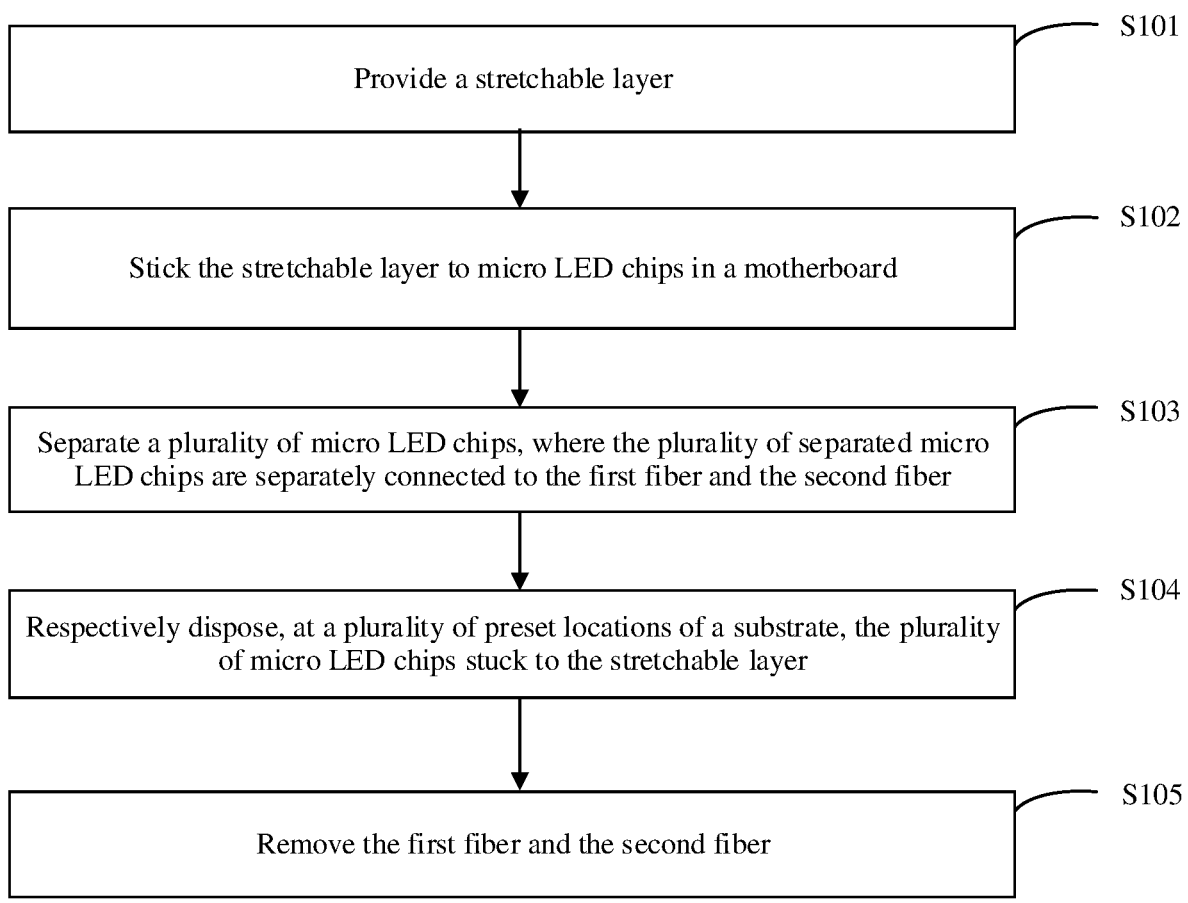
FIG. 4 is a flowchart of a chip transfer method according to an embodiment of this application.

The following describes in detail a chip transfer method for transferring the micro LED chips 101 in the motherboard 21 to the substrate 20 in batches provided in this embodiment of this application. As shown in FIG. 4, the chip transfer method includes S101 to S105.

S101: Provide a stretchable layer 30.

Figure 5A:
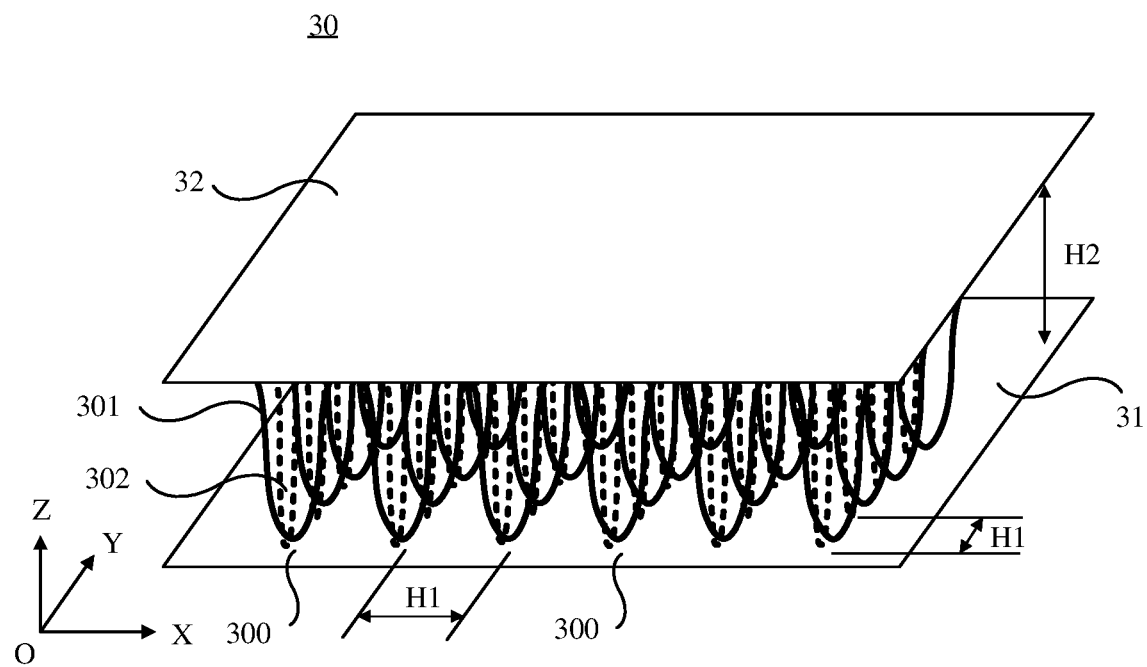
FIG. 5A is a schematic diagram of a structure of a stretchable layer according to an embodiment of this application.

As shown in FIG. 5A, the stretchable layer 30 may include a plurality of first fibers 301 and a plurality of second fibers 302, and a first cloth layer 31 and a second cloth layer 32 that are stacked. The first fiber 301 extending in a first direction X and the second fiber 302 extending in a second direction Y intersect between the first cloth layer 31 and the second cloth layer 32, and a plurality of intersections 300 exist between the first fiber 301 and the second fiber 302. The first direction X intersects with the second direction Y, for example, may be vertically disposed.

It should be noted that, as shown in FIG. 5A, the first direction X and the second direction Y may form an XOY plane, the first cloth layer 31 may be parallel to the XOY plane, and the second cloth layer 32 may be parallel to the XOY plane. In this case, that the first cloth layer 31 and the second cloth layer 32 are stacked means that in a Z direction perpendicular to the XOY plane, the first cloth layer 31 may be located below the second cloth layer 32, or the first cloth layer 31 may be located above the second cloth layer 32. FIG. 5A is described by using an example in which the first cloth layer 31 is located below the second cloth layer 32.

For example, that the first fiber 301 and the second fiber 302 intersect between the first cloth layer 31 and the second cloth layer 32 means that the first fiber 301 extends between the first cloth layer 31 and the second cloth layer 32 in the first direction X (that is, a horizontal direction), and the second fiber 302 extends between the first cloth layer 31 and the second cloth layer 32 in the second direction Y (a vertical direction). Because the first direction X intersects with the second direction Y, for example, may be disposed vertically, a horizontally extending first fiber 301 intersects with a plurality of vertically extending second fibers 302. Similarly, a vertically extending second fiber 302 intersects with a plurality of horizontally extending first fibers 301. In this case, the first fiber 301 and the second fiber 302 can horizontally and vertically intersect between the first cloth layer 31 and the second cloth layer 32. Optionally, any two first fibers 301 may be parallel to each other, and any two second fibers 302 may be parallel to each other.

In addition, a first spacing H1 exists between two adjacent intersections 300 at the stretchable layer 30, and a second spacing H2 exists between the first cloth layer 31 and the second cloth layer 32. In some embodiments of this application, as shown in FIG. 3B, the initial spacing Ha exists between two adjacent micro LED chips 101 in the motherboard 21. The first spacing H1 and the initial spacing Ha may meet a condition that H1=Ha. Alternatively, in some other embodiments of this application, when not all micro LED chips 101 in the motherboard 21 need to be transferred, a value of the first spacing H1 may be set based on a location of the micro LED chip 101 that needs to be transferred.

It should be noted that, in this embodiment of this application, two adjacent intersections 300 are two intersections 300 adjacent in a horizontal or vertical location, for example, as shown in FIG. 5A, in the first direction X (that is, the horizontal direction), two intersections 300 that are located at adjacent locations, or in the second direction Y (that is, the vertical direction), two intersections 300 that are located at adjacent locations.

Figure 5B:
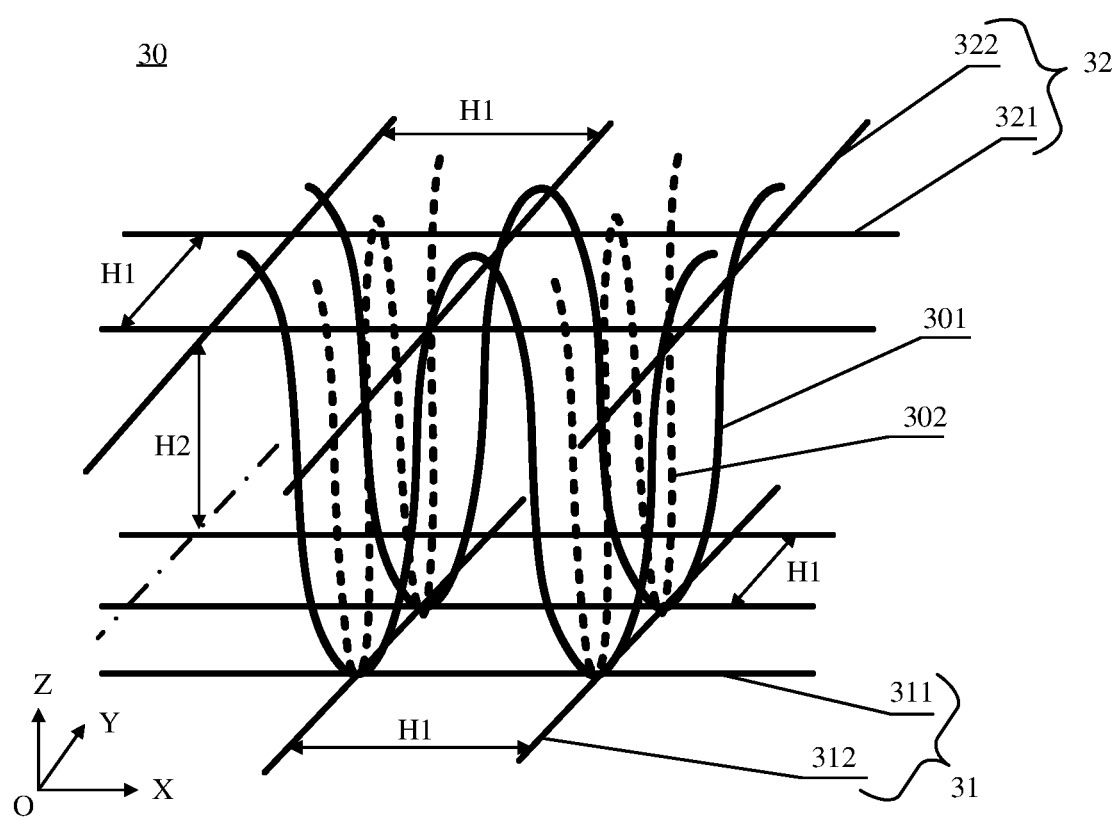
FIG. 5B is a schematic diagram of a structure of another stretchable layer according to an embodiment of this application.

In some embodiments of this application, S101 may specifically include the following details: First, as shown in FIG. 5B, a plurality of first warp threads 312 and a plurality of first weft threads 311 are intersected to form the first cloth layer 31. A spacing between two adjacent first warp threads 312 is the same as the first spacing H1, and a spacing between two adjacent first weft threads 311 is the same as the first spacing H1. It should be noted that, in this embodiment of this application, any two first weft threads 311 may be parallel to each other. For example, as shown in FIG. 5B, any first weft thread 311 may be parallel to the first direction X, that is, disposed horizontally. Any two first warp threads 312 are parallel to each other. For example, any first warp thread 312 may be parallel to the second direction Y, that is, disposed vertically. In this case, that the plurality of first warp threads 312 intersect with the plurality of first weft threads 311 means that a horizontally disposed first weft thread 311 intersects with a plurality of vertically disposed first warp threads 312. Similarly, a vertically disposed first warp thread 312 intersects with a plurality of horizontally disposed first weft threads 311.

In addition, a plurality of second warp threads 322 and a plurality of second weft threads 321 are intersected to form the second cloth layer 32. A spacing between two adjacent second warp threads 322 is the same as the first spacing H1, and a spacing between two adjacent second weft threads 321 is the same as the first spacing H1. A vertical projection of the second warp thread 322 at the first cloth layer 31 is located between two adjacent first warp threads 312, and a vertical projection of the second weft thread 321 at the first cloth layer 31 is located between two adjacent second weft threads 321.

Similarly, any two second weft threads 321 may be parallel to each other. For example, as shown in FIG. 5B, any second weft thread 321 may be parallel to the first direction X, that is, disposed horizontally. Any two second warp threads 322 are parallel to each other. For example, any second warp thread 322 may be parallel to the second direction Y, that is, disposed vertically. In this case, that the plurality of second warp threads 322 intersect with the plurality of second weft threads 321 means that a horizontally disposed second weft thread 321 intersects with a plurality of vertically disposed second warp threads 322. Similarly, a vertically disposed second warp thread 322 intersects with a plurality of horizontally disposed second weft threads 321.

In addition, it can be learned from the foregoing description that the first cloth layer 31 may be parallel to the XOY plane shown in FIG. 5B. Based on this, the vertical projection of the second warp thread 322 at the first cloth layer 31 is a projection formed by the second warp thread 322 at the first cloth layer 31 in the Z direction perpendicular to the XOY plane. Similarly, the vertical projection of the second weft thread 321 at the first cloth layer 31 is a projection formed by the second weft thread 321 at the first cloth layer 31 in the Z direction perpendicular to the XOY plane. The following "vertical projection" manner may be obtained in a similar manner, and details are not described again.

On this basis, the first fiber 301 intersects, along the first direction X, with the first warp thread 312 located below and the second warp thread 322 located above. In addition, the second fiber 302 intersects, along the second direction Y, with the first weft thread 311 located below and the second weft thread 321 located above. In this case, the first fiber 301 and the second fiber 302 can horizontally and vertically intersect between the first cloth layer 31 and the second cloth layer 32.

It should be noted that the second spacing H2 in FIG. 5B is represented by a spacing between the second warp thread 322 at the second cloth layer 32 and the vertical projection (represented by drawn fine dotted lines) of the second warp thread 322 at the first cloth layer 31. Representation manners of the second spacing H2 in the following accompanying drawings are the same, and details are not described again.

In this case, that the first fiber 301 and the second fiber 302 horizontally and vertically intersect between the first cloth layer 31 and the second cloth layer 32 means that the first fiber 301 and the second fiber 302 intersect horizontally and vertically, and the first fiber 301 and the second fiber 302 further intersect with the first cloth layer 31 and the second cloth layer 32.

It can be learned from the foregoing description that, in a process of forming the first cloth layer, 31, the spacing between two adjacent first warp threads 312 and the spacing between two adjacent first weft threads 311 need to be controlled to be the same as the first spacing H1. In some embodiments of this application, a method for controlling the spacing between two adjacent first warp threads 312 and the spacing between two adjacent first weft threads 311 may be shown in FIG. 6A. A plurality of first locating pins 41 may be disposed around the motherboard 21, and a first locating pin 41 is disposed between every two adjacent first warp threads 312 and in contact with two adjacent first warp threads 312.

The first locating pin 41 has a first geometric length L1, and L1=H1. A direction of the first geometric length L1 of the first locating pin 41 is respectively perpendicular to two adjacent first weft threads 312. In this way, because the first locating pin 41 is disposed between two adjacent first warp threads 312 and in contact with two adjacent first warp threads 312, the spacing between two adjacent first warp threads 312 can be controlled by setting the first geometric length L1 of the first locating pin 41, so that the spacing between two adjacent first warp threads 312 is the same as the first spacing H1.

In addition, a plurality of second locating pins 42 are disposed around the motherboard 21, and a second locating pin 42 is disposed between every two adjacent first weft threads 311 and in contact with two adjacent first weft threads 311. The second locating pin 42 has a second geometric length L2, and L2=H1. In this way, the spacing between two adjacent first weft threads 311 can be controlled by setting the second geometric length L2 of the second locating pin 42, so that the spacing between two adjacent first weft threads 311 is the same as the first spacing H1. A direction of the second geometric length L2 of the second locating pin 42 is respectively perpendicular to two adjacent first weft threads 311.

It should be noted that, in a process of controlling the spacing between two adjacent first warp threads 312 and the spacing between two adjacent first weft threads 311, a clamping component (not shown in the figure) may be used. For example, a robotic arm clamps two ends of each first warp thread 312 and each first weft thread 311, to prevent the first warp thread 312 and the first weft thread 311 from being in a loose state. In this case, the second spacing H2 (as shown in FIG. 5B) between the first cloth layer 31 and the second cloth layer 32 may be further adjusted by moving the robotic arm. For example, in some embodiments of this application, the second spacing H2 and the welding spacing Hb may meet a condition that H2=Hb/2, so that after the first fiber 301 and the second fiber 302 are stretched in following steps, a spacing between two adjacent micro LED chips 101 at the stretchable layer 30 can be extended from the original initial spacing Ha to the welding spacing Hb.

The foregoing description is provided by using an example in which cross sections (parallel to the motherboard 21) of the first locating pin 41 and the second locating pin 42 each are a rectangle. In this case, as shown in FIG. 6B, the first locating pin 41 is used as an example, and the first locating pin 41 may be a cuboid. Alternatively, in some other embodiments of this application, cross-sectional dimensions of the first locating pin 41 and the second locating pin 42 may each be a circle. In this case, as shown in FIG. 6C, the first locating pin 41 is used as an example, and the first locating pin 41 may be a cylinder.

Figure 6A:
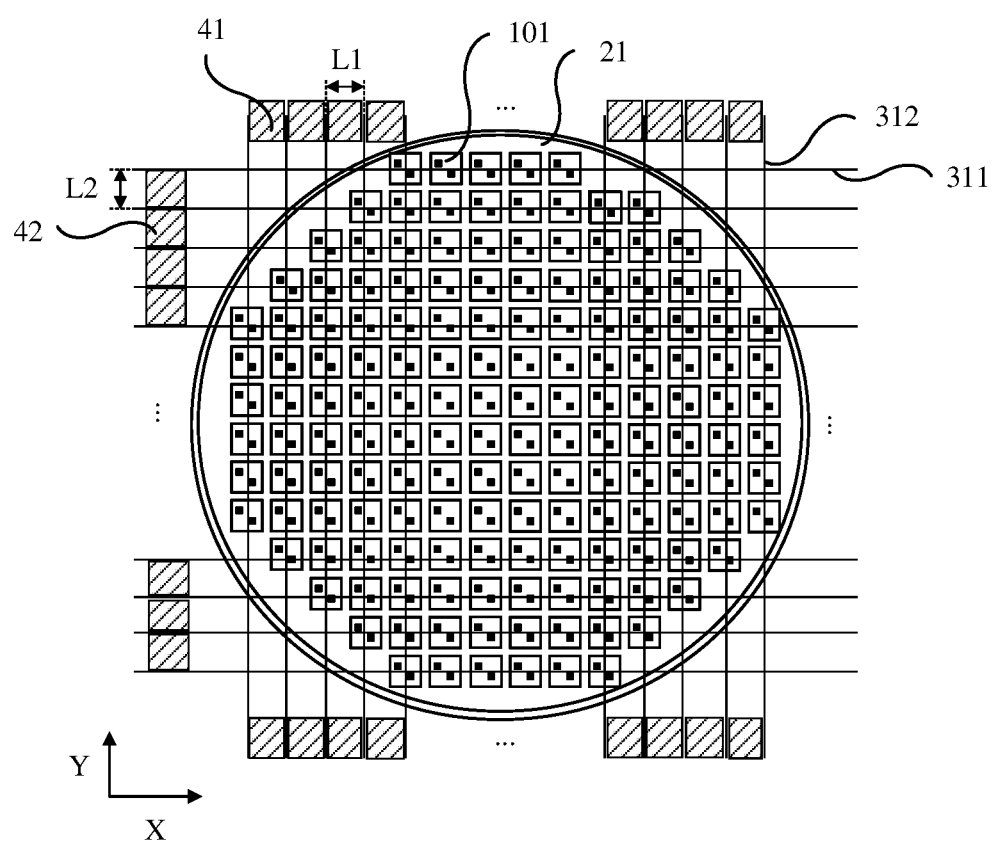
FIG. 6A is a schematic diagram of locating a stretchable layer according to an embodiment of this application.
Figure 6B:
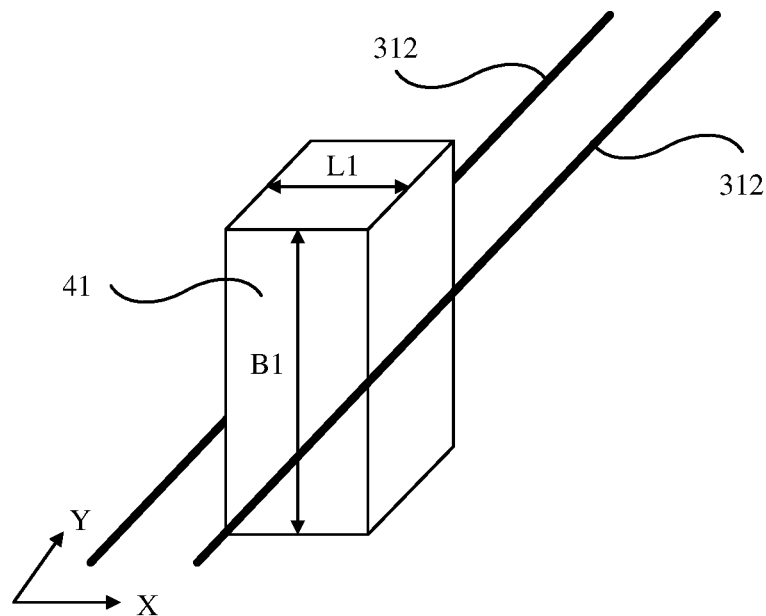
FIG. 6B is a schematic diagram of a structure of the first locating pin in FIG. 6A.
Figure 6C:
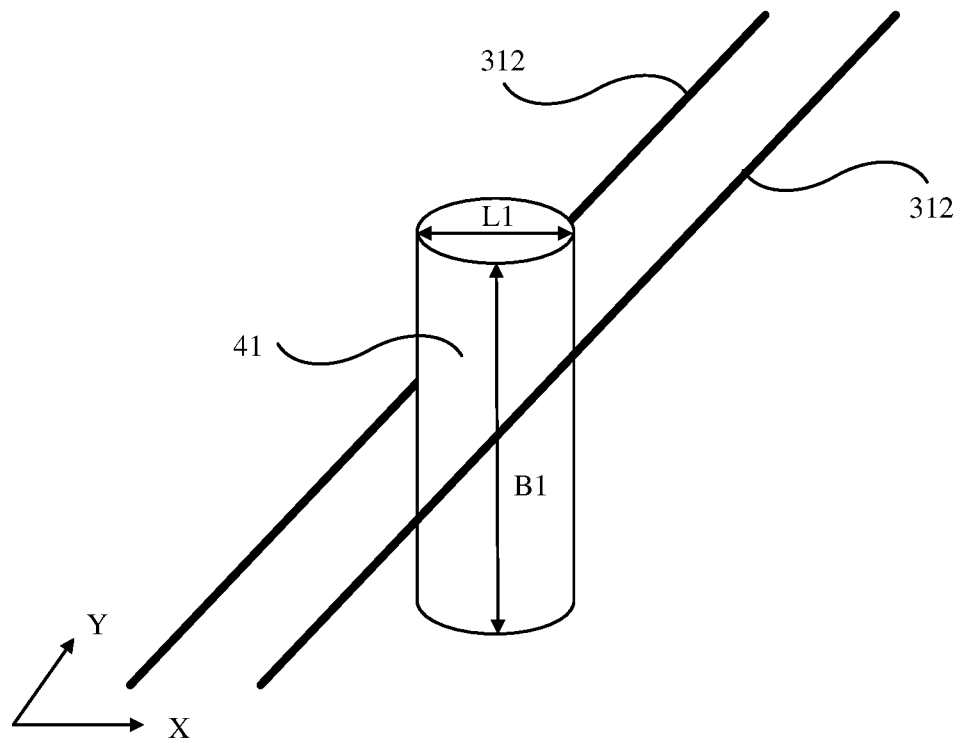
FIG. 6C is a schematic diagram of another structure of the first locating pin in FIG. 6A.

Therefore, as shown in FIG. 6A, the first geometric length L1 of the first locating pin 41 refers to a distance between two opposite sides of the first locating pin 41 in a direction perpendicular to the first warp thread 312, for example, the first direction X. Similarly, the second geometric length L2 of the second locating pin 42 refers to a distance between two opposite sides of the second locating pin 42 in a direction perpendicular to the first weft thread 311, for example, the second direction Y.

In addition, the foregoing describes the method for controlling the spacing between two adjacent first warp threads 312 and the spacing between two adjacent first weft threads 311 at the first cloth layer 31 by using the first locating pin 41 and the second locating pin 42. A method for controlling the spacing between two adjacent second warp threads 322 and the spacing between two adjacent second weft threads 321 at the second cloth layer 32 is the same as that described above, and details are not described herein again.

Figure 7:
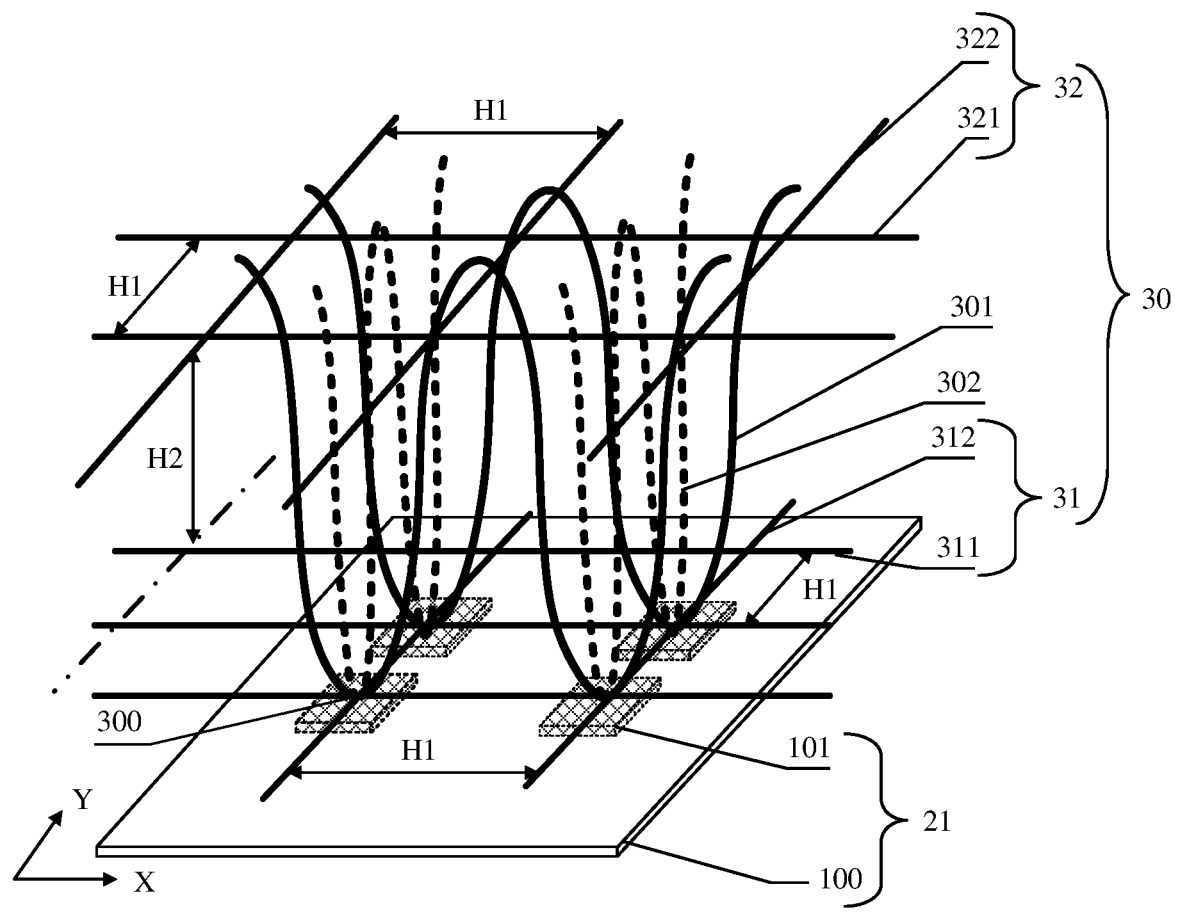
FIG. 7 is a schematic diagram of sticking a stretchable layer to a motherboard according to an embodiment of this application.

It should be noted that the foregoing description is provided by using an example in which the spacing between any two adjacent micro LED chips 101 in the motherboard 21 is the first spacing H1 (as shown in FIG. 7). In some other embodiments of this application, the spacing between two adjacent micro LED chips 101 in the motherboard 21 may alternatively be different. In this case, the first geometric length L1 of the first locating pin 41 and the second geometric length L2 of the second locating pin 42 may be set based on a spacing requirement, to meet a different spacing requirement of two adjacent micro LED chips 101.

S102: As shown in FIG. 7, stick the stretchable layer 30 to the micro LED chips 101 in the motherboard 21.

In some embodiments of this application, after the stretchable layer 30 is stuck to the micro LED chips 101, the first cloth layer 31 may be close to the micro LED chips 101, and the second cloth layer 32 may be away from the micro LED chips 101. Alternatively, in some other embodiments of this application, locations of the first cloth layer 31 and the second cloth layer 32 may be interchanged. The following uses an example in which the first cloth layer 31 is closer to the micro LED chips 101 for description.

In addition, when the micro LED chips 101 in the motherboard 21 all need to be transferred, an intersection 300 of the first fiber 301 and the second fiber 302 at the stretchable layer 30 is aligned and stuck to a micro LED chip 101 in the motherboard 21, so that a plurality of intersections 300 at the stretchable layer 30 and a plurality of micro LED chips 101 in the motherboard 21 are stuck in one-to-one alignment.

It should be noted that an intersection 300 is stuck to a micro LED chip 101 in the motherboard 21 in alignment means that after the stretchable layer 30 is stuck to the micro LED chip 101, a vertical projection of an intersection 300 on the motherboard 21 overlaps at least a part of the micro LED chip 101. For example, a vertical projection of an intersection 300 on the motherboard 21 may overlap a center of a micro LED chip 101, or a vertical projection of an intersection 300 on the motherboard 21 may overlap a part around a center of a micro LED chip 101. Alternatively, a vertical projection of an intersection 300 on the motherboard 21 may completely overlap a micro LED chip 101. Therefore, when S102 is performed, an intersection 300 may be accurately stuck to a location at which a micro LED chip 101 in the motherboard 21 is located.

Figure 8:
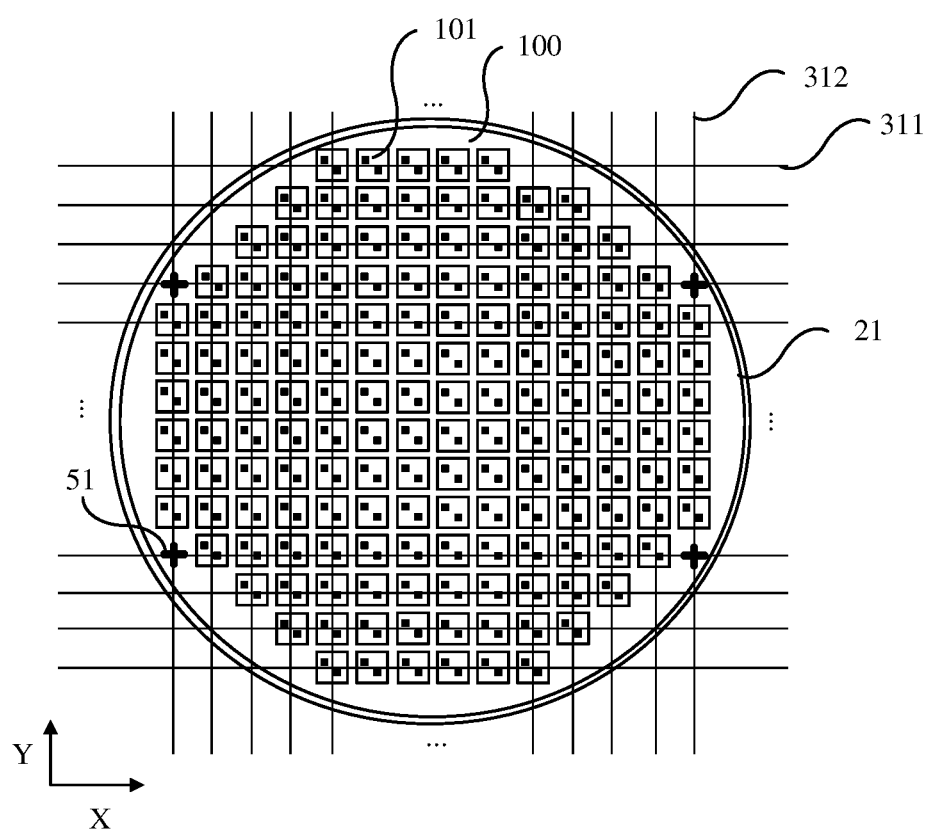
FIG. 8 is a schematic diagram of aligning a stretchable layer with a motherboard according to an embodiment of this application.

It should be noted that S102 is described above by using an example in which the micro LED chips 101 in the motherboard 21 all need to be transferred. When only some of the micro LED chips 101 in the motherboard 21 need to be transferred, in a process of performing S102, some intersections 300 of the first fiber 301 and the second fiber 302 at the stretchable layer 30 may be aligned and stuck to a plurality of micro LED chips 101 in the motherboard 21 one to one, and some other intersections 300 at the stretchable layer 30 do not need to be stuck to the micro LED chips 101. In this way, partial transfer of the micro LED chips 101 in the motherboard 21 is implemented, to meet requirements of the micro LED display 10 on different resolutions. For ease of description, an example in which all the micro LED chips 101 in the motherboard 21 are transferred is used below for description. In some embodiments of this application, to align the stretchable layer 30 with the motherboard 21, as shown in FIG. 8, a plurality of first alignment marks 51 may be manufactured on the substrate 100 that is in the motherboard 21 and that is configured to carry the micro LED chips 101. The plurality of first alignment marks 51 may be located around the substrate 100. For example, FIG. 8 is described by using an example in which a first alignment mark 51 is separately disposed at four corner locations around the substrate 100. A material of the first alignment mark 51 may be a metal material, and is formed by using a photolithography process (including processes such as masking, exposure, development, and etching).

Next, before S102 is performed, locations of the first alignment mark 51 and the stretchable layer 30 may be obtained by using a camera, for example, a charge coupled device (charge coupled device, CCD). A processor (not shown in the figure) may control, based on a collection result of the CCD by using the robotic arm, a location of a first warp thread 312 or a first weft thread 311 at an edge of the stretchable layer 30, so that the location can overlap a location of at least one first alignment mark 51, to align the stretchable layer 30 with the motherboard 21. A first warp thread 312 at a leftmost end in FIG. 8 overlaps locations of an upper first alignment mark 51 and a lower first alignment mark 51 on a left side of the substrate 100. A first warp thread 312 at a rightmost end overlaps locations of an upper first alignment mark 51 and a lower first alignment mark 51 on a right side of the substrate 100.

For example, in a process of performing S102, to improve sticking precision of a location at which an intersection 300 and a micro LED chip 101 in the motherboard 21 are located, when a single-side size of the micro LED chip 101 is 10 μm, alignment precision between the stretchable layer 30 and the motherboard 21 may be not less than 0.5 μm. That is, the alignment precision between the stretchable layer 30 and the motherboard 21 is not less than 5% of the single-side size of the micro LED chip 101.

The following describes, by using an example, a method for sticking the stretchable layer 30 on the motherboard 21 in the process of performing S102.

Figure 9A:
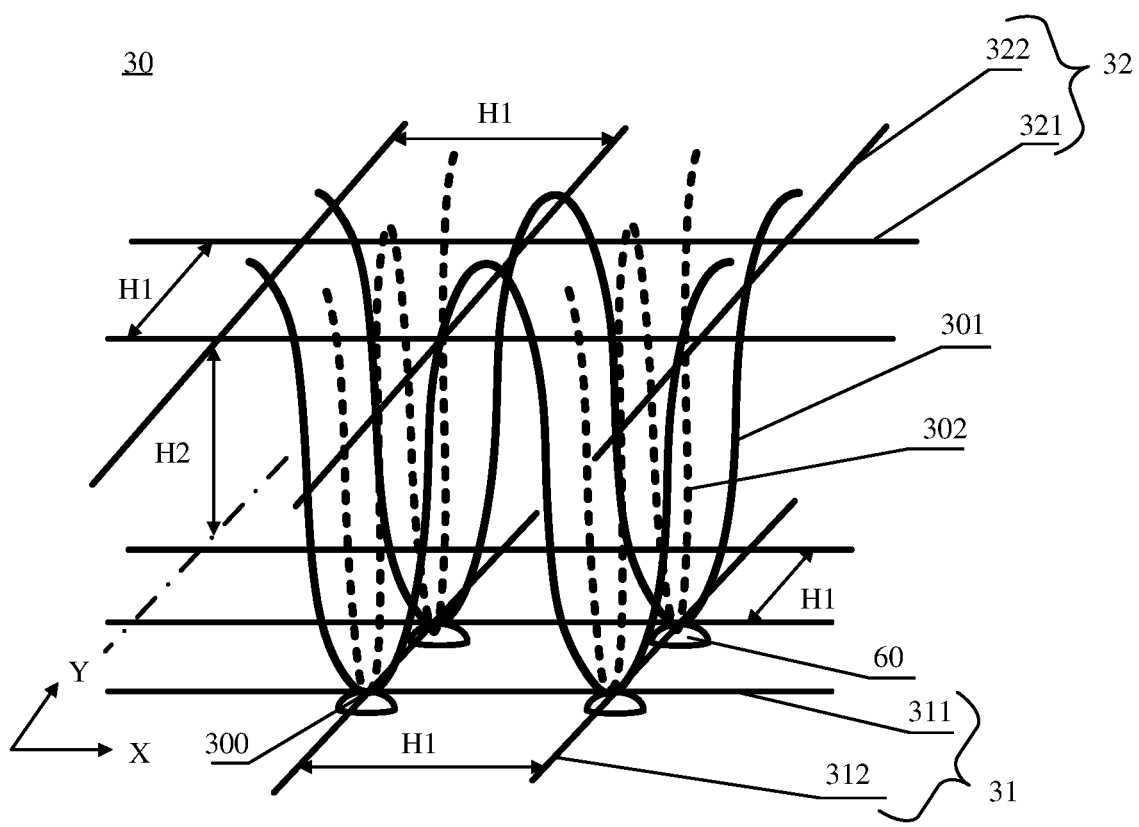
FIG. 9A is a schematic diagram of forming an adhesive layer at a stretchable layer according to an embodiment of this application.
Figure 9B:
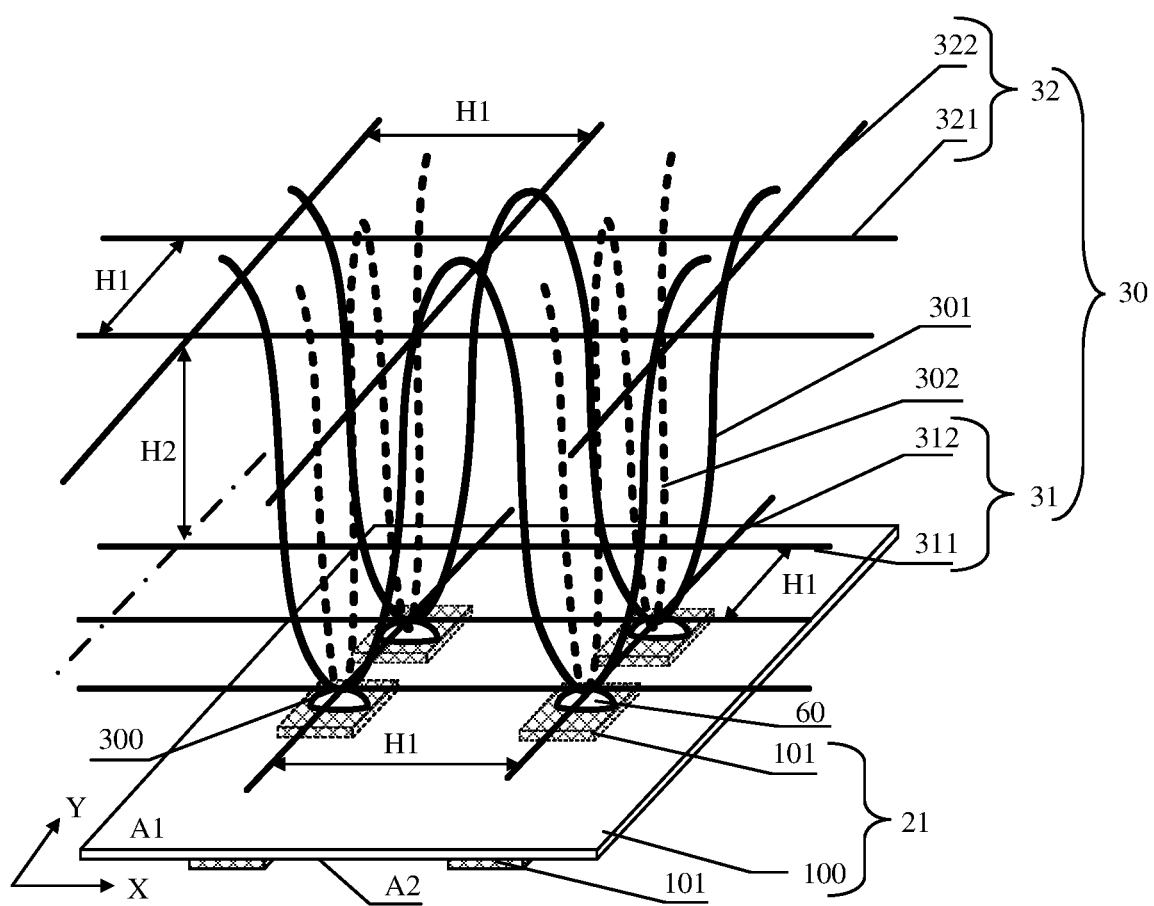
FIG. 9B is another schematic diagram of sticking a stretchable layer to a motherboard according to an embodiment of this application.

In some embodiments of this application, S102 may include that, as shown in FIG. 9A, first, an adhesive layer 6o is coated at the intersection 300 of the first fiber 301 and the second fiber 302 at least the first cloth layer 31. Then, as shown in FIG. 9B, a surface of a side of the stretchable layer 30 coated with the adhesive layer 60 is stuck to the motherboard 21, so that a vertical projection of an intersection 300 on the motherboard 21 overlaps a micro LED chip 101 in the motherboard 21.

Based on this, in this embodiment of this application, an intersection 300 may be stuck to a micro LED chip 101 in the motherboard 21 in alignment in two manners. A first implementation may be as follows: As shown in FIG. 9B, an intersection 300 at the stretchable layer 30 is stuck, through the adhesive layer 60, to a surface of a side A1 of the substrate 100 that is in the motherboard 21 and that is away from the micro LED chip 101 (the micro LED chip 101 that is located below the substrate 100 is represented by dashed lines). In this way, a case in which surfaces of a side on which the first electrode 110 and the second electrode 120 in the micro LED chip 101 are located are in contact with the adhesive layer 60, and therefore performance of the micro LED chip 101 is affected can be avoided.

In this case, the micro LED chip 101 is located on a surface A2 of the substrate 100. The surface A2 is disposed opposite to the surface A1, and the surface A1 of the substrate 100 faces the stretchable layer 30. In addition, a vertical projection of an intersection 300 on the substrate 100 overlaps a vertical projection of a micro LED chip 101 on the substrate 100, so that it can be ensured that an intersection 300 is stuck to a micro LED chip 101 in the motherboard 21 in alignment.

Figure 9C:
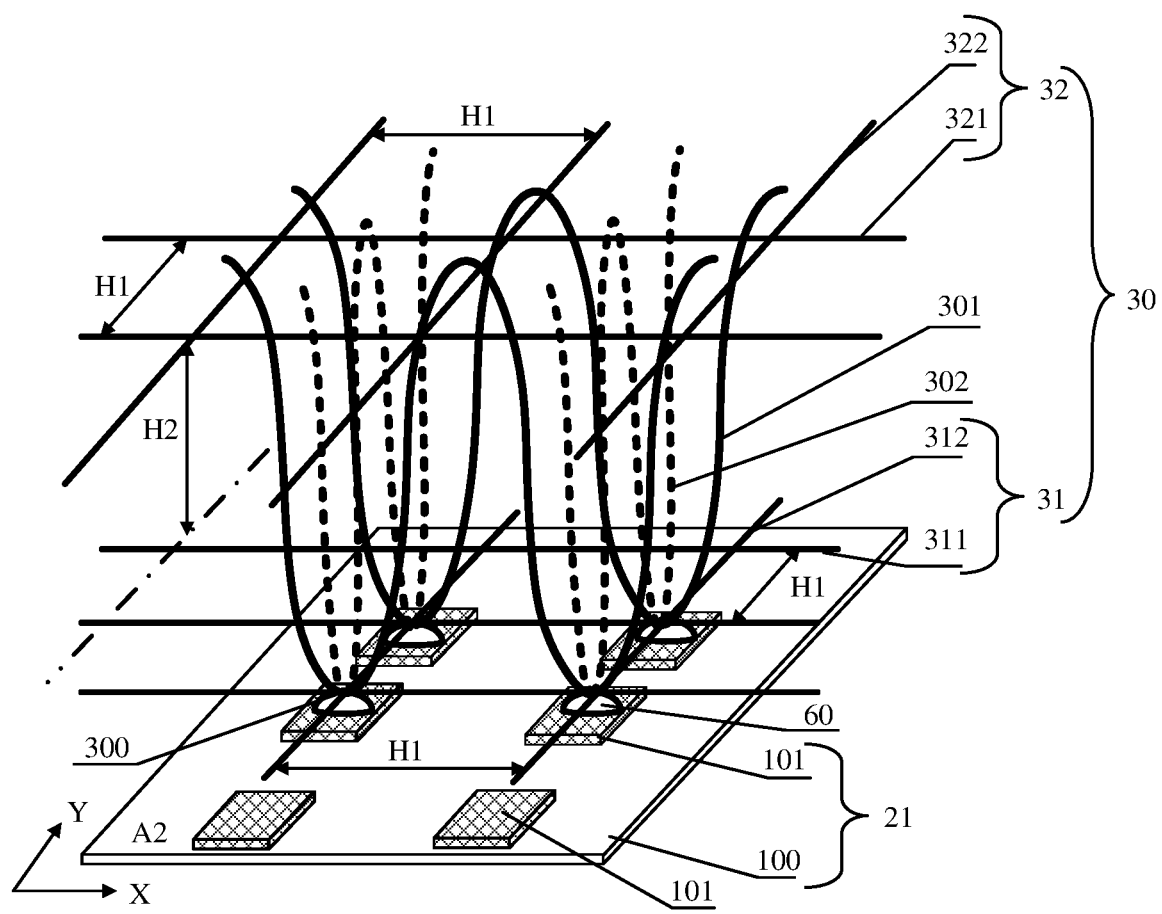
FIG. 9C is another schematic diagram of sticking a stretchable layer to a motherboard according to an embodiment of this application.

A second implementation may be as follows: As shown in FIG. 9C, an intersection 300 at the stretchable layer 30 is stuck, through the adhesive layer 60, to a surface of a side that is of the micro LED chip 101 (the micro LED chip 101 that is located above the substrate 100 is represented by sold lines) and that is away from the substrate 100. In this case, the surface A2 of the substrate 100 faces the stretchable layer 30, and the first fiber 301, the second fiber 302, and the micro LED chip 101 are all located on a side on which the surface A2 of the substrate 100 is located. A vertical projection of an intersection 300 on the substrate 100 may still overlap a vertical projection of a micro LED chip 101 on the substrate 100.

Figure 10A:
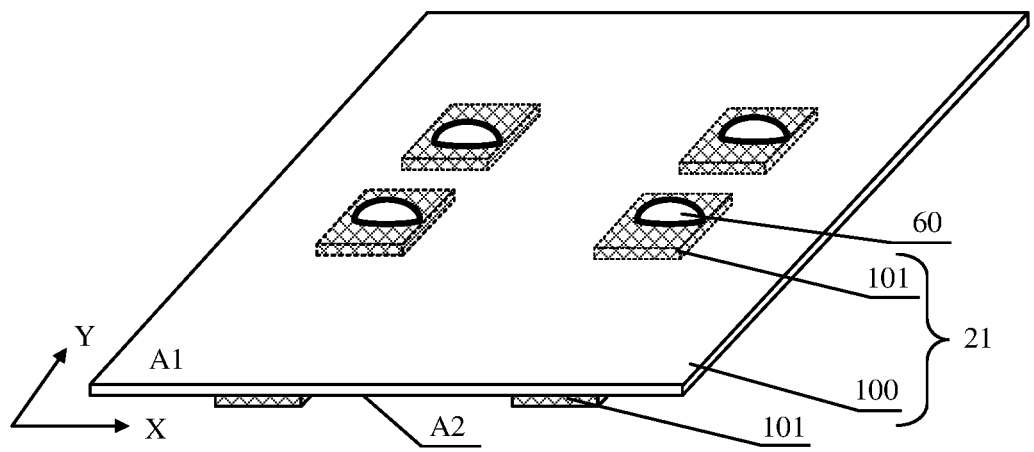
FIG. 10A is a schematic diagram of forming an adhesive layer at a location at which a chip on a motherboard is located according to an embodiment of this application.

Alternatively, in some other embodiments of this application, S102 may include: first dispensing adhesive on the motherboard 21 to form a plurality of adhesive layers 60, as shown in FIG. 10A. A vertical projection of an adhesive layer 60 on the motherboard 21 overlaps a micro LED chip 101 in the motherboard 21, that is, a vertical projection of an adhesive layer 60 on the substrate 100 overlaps a vertical projection of a micro LED chip 101 on the substrate 100. For example, as shown in FIG. 1A, based on an adhesive dispensing process, an adhesive dispensing array including a plurality of adhesive layers 60 may be formed on the surface of the side A1 that is of the substrate 100 and that is away from the micro LED chip 101 (the micro LED chip 101 that is located below the substrate 100 is represented by dashed lines). In this case, the micro LED chip 101 is located on the surface A2 of the substrate 100, and the surface A1 of the substrate 100 faces the adhesive layer 60.

Figure 10B:
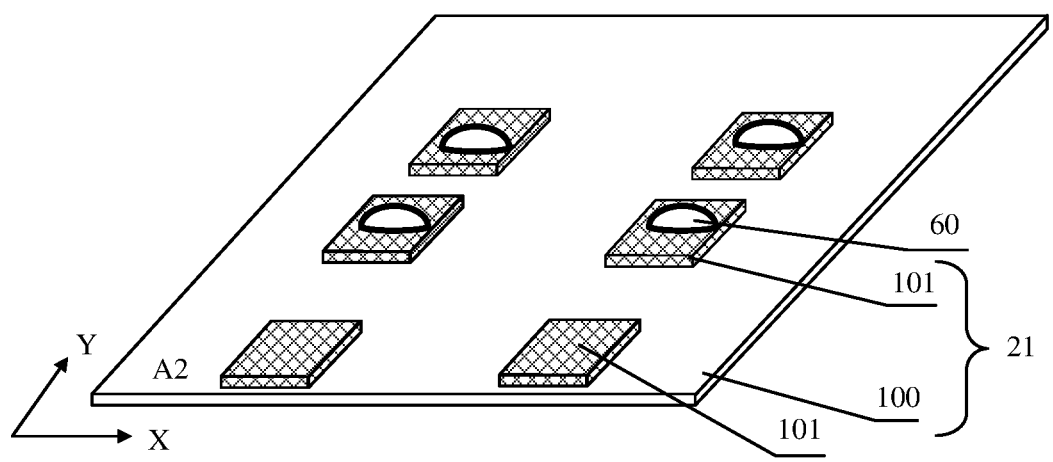
FIG. 10B is another schematic diagram of forming an adhesive layer at a location at which a chip on a motherboard is located according to an embodiment of this application.

Then, as shown in FIG. 9B, a surface of a side on which the first cloth layer 31 at the stretchable layer 30 is located is stuck to the motherboard 21 through the adhesive layer 60, so that a vertical projection of an intersection 300 on the motherboard 21 overlaps an adhesive layer 60. It can be learned from the foregoing description that a vertical projection of an adhesive layer 60 on the motherboard 21 overlaps a micro LED chip 101 in the motherboard 21, so that it can be ensured that an intersection 300 is stuck to a micro LED chip 101 in alignment through an adhesive layer 60. Alternatively, for another example, as shown in FIG. 10B, by using the adhesive dispensing process, the adhesive layer 60 may be formed on the surface of the side that is of the micro LED chip 101 (the micro LED chip 101 that is located above the substrate 100 is represented by solid lines) and that is away from the substrate 100. In this case, the surface A2 of the substrate 100 faces the adhesive layer 60.

Then, as shown in FIG. 9C, the surface of the side on which the first cloth layer 31 at the stretchable layer 30 is located is stuck to the motherboard 21 through the adhesive layer 60, so that an intersection 300 is stuck to a micro LED chip 101 in the motherboard 21 in alignment. In this case, the first fiber 301, the second fiber 302, and the micro LED chip 101 are all located on the side on which the surface A2 of the substrate 100 is located.

Figure 11A:
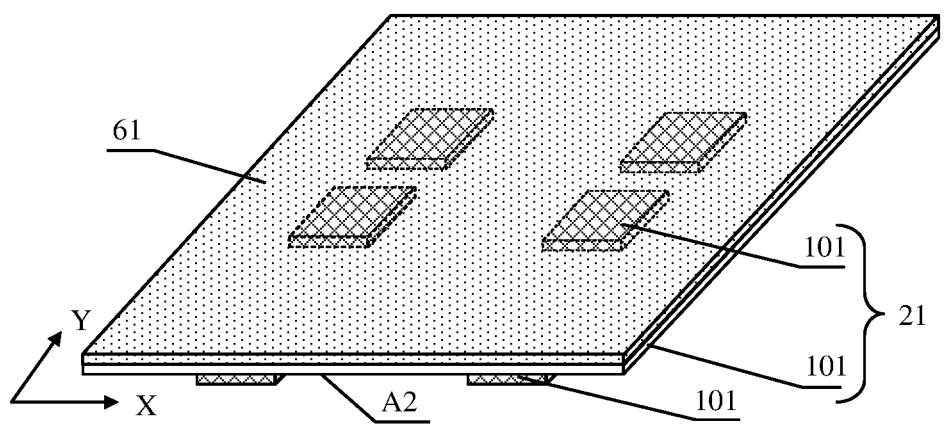
FIG. 11A is a schematic diagram of forming a colloidal material layer on a motherboard according to an embodiment of this application.
Figure 11B:
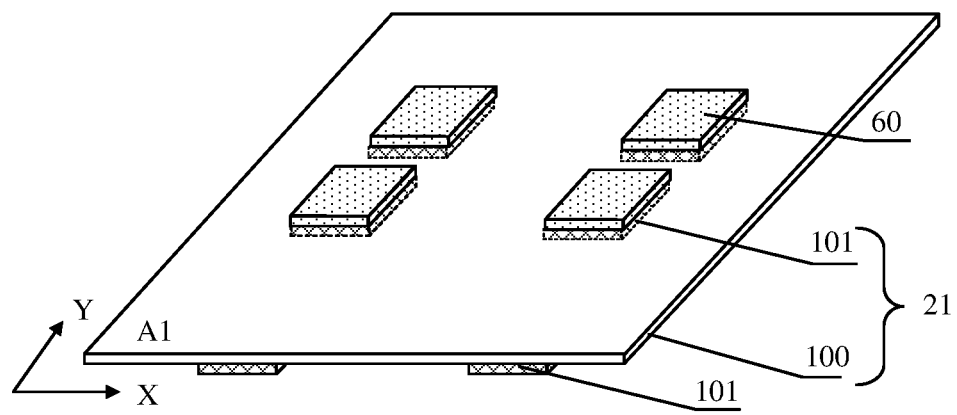
FIG. 11B is a schematic diagram of patterning the colloidal material layer shown in FIG. 1A.

In some other embodiments of this application, S102 may include that, as shown in FIG. 11A, a colloidal material layer 61 is coated on the motherboard 21. For example, as shown in FIG. 11A, the colloidal material layer 61 may be coated on the surface of the side A1 that is of the substrate 100 and that is away from the micro LED chip 101 (the micro LED chip 101 that is located below the substrate 100 is represented by dashed lines). The colloidal material layer 61 may cover the surface A1 of the substrate 100. Therefore, the surface A1 is not shown in FIG. 11A. In this case, the micro LED chip 101 is located on the surface A2 of the substrate 100. Then, patterning (pattern) may be performed on the colloidal material layer 61 by using a mask exposure process, so that a plurality of adhesive layers 60 shown in FIG. 11B are formed on the motherboard 21. A vertical projection of an adhesive layer 60 on the motherboard 21 overlaps a micro LED chip 101 in the motherboard 21. In this way, the plurality of adhesive layers 60 on the motherboard 21 may be formed in a same mask exposure process, and therefore efficiency of a manufacturing process can be improved.

Figure 11C:
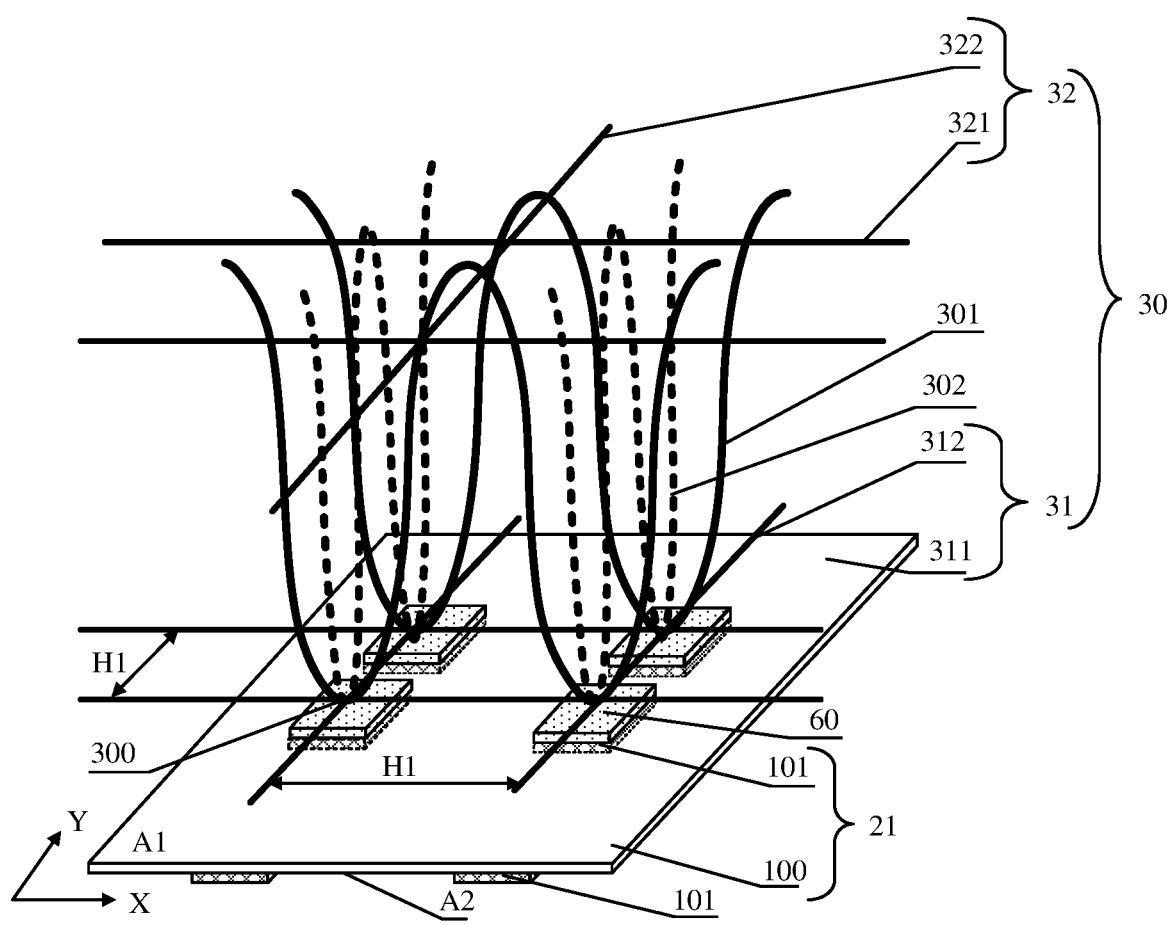
FIG. 11C is another schematic diagram of sticking a stretchable layer to a motherboard according to an embodiment of this application.

Then, as shown in FIG. 11C, the surface of the side on which the first cloth layer 31 at the stretchable layer 30 is located is stuck to the motherboard 21 through the adhesive layer 60, so that an intersection 300 is stuck to a micro LED chip 101 in the motherboard 21 in alignment. In this case, an intersection 300 is stuck, through the adhesive layer 60, to the surface of the side A1 that is of the substrate 100 and that is away from the micro LED chip 101.

Figure 12A:
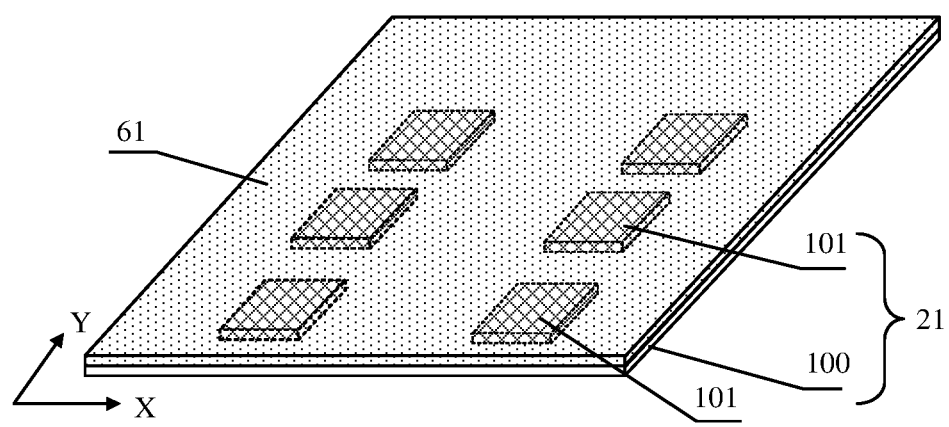
FIG. 12A is a schematic diagram of forming a colloidal material layer on a motherboard according to an embodiment of this application.
Figure 12B:
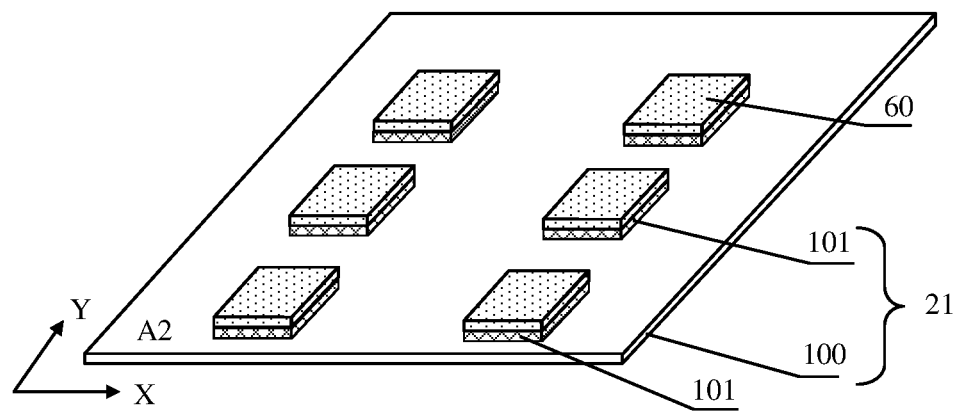
FIG. 12B is a schematic diagram of patterning the colloidal material layer shown in FIG. 12A.

Alternatively, for another example, as shown in FIG. 12A, the colloidal material layer 61 may be coated on the surface of the side that is of the micro LED chip 101 and that is away from the substrate 100. The colloidal material layer 61 may cover the micro LED chip 101 and the substrate 100. Then, the patterning (pattern) may be performed on the colloidal material layer 61 by using the mask exposure process, so that the adhesive layers 60 shown in FIG. 12B is formed at a location at which each micro LED chip 101 in the motherboard 21 is located.

Figure 12C:
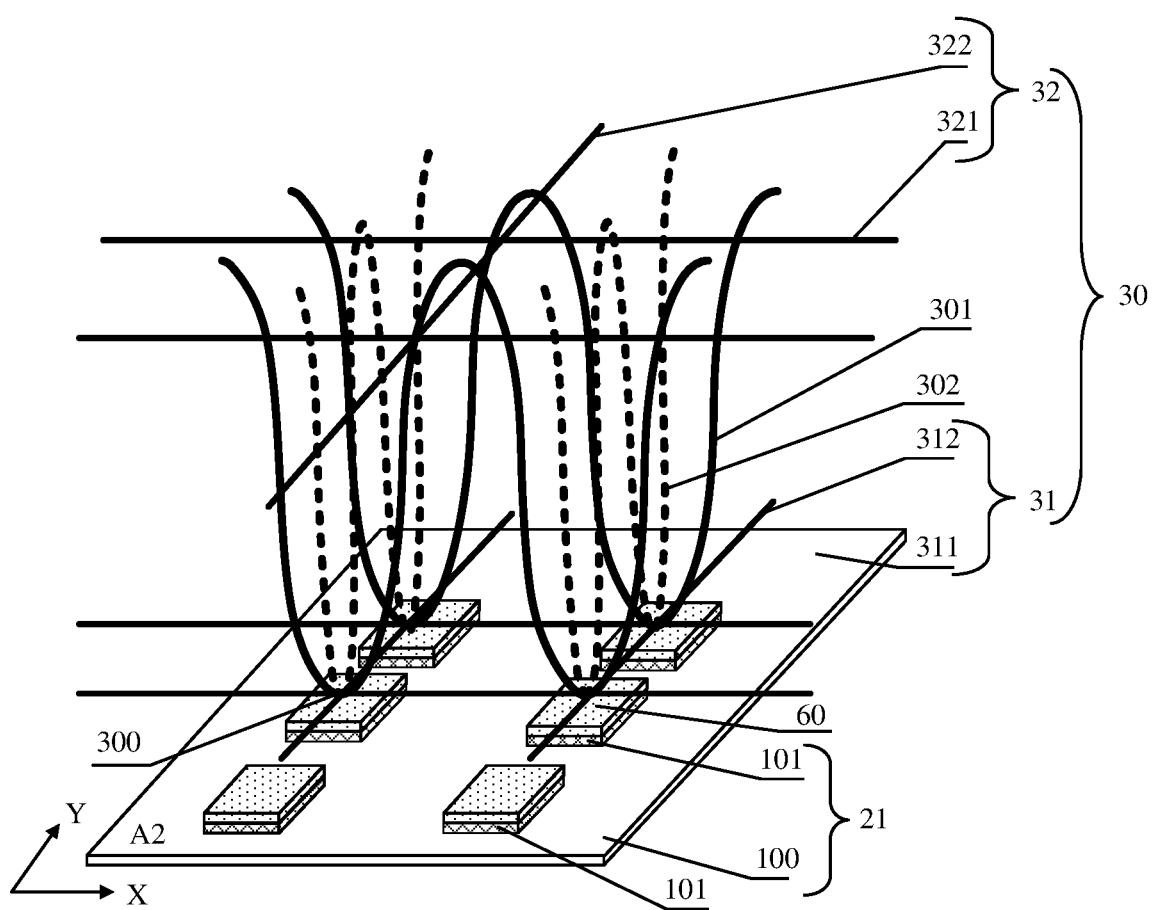
FIG. 12C is another schematic diagram of sticking a stretchable layer to a motherboard according to an embodiment of this application.

Then, as shown in FIG. 12C, the surface of the side on which the first cloth layer 31 at the stretchable layer 30 is located is stuck to the motherboard 21 through the adhesive layer 60, so that an intersection 300 is stuck to a micro LED chip 101 on the substrate 100 of the motherboard 21 in alignment. In this case, the first fiber 301, the second fiber 302, and the micro LED chip 101 are all located on the side on which the surface A2 of the substrate 100 is located. An intersection 300 is stuck, through the adhesive layer 60, to the surface of the side that is of the micro LED chip 101 and that is away from the substrate 100.

It should be noted that the foregoing describes merely an example for performing S102, and other manners are not described herein. For ease of description, an example in which an intersection 300 is stuck, through the adhesive layer 60, to the surface of the side A1 that is of the substrate 100 and that is away from the micro LED chip 101 is used below for description.

A material of the adhesive layer 60 is not limited in this application. For example, the adhesive layer 60 may be UV adhesive. The UV adhesive can undergo a cross-linking reaction under irradiation of the UV adhesive with a specific wavelength, to complete curing. A higher curing degree indicates stronger stickiness of the adhesive layer 60. For example, the adhesive layer 60 may be formed by mixing at least one of acrylate or epoxy acrylate with the photoinitiator. In this case, when UV light with a wavelength of 345 nm, 365 nm, 385 nm, or 405 nm is used to irradiate the adhesive layer 60, the cross-linking reaction may occur in the adhesive layer 60 to implement the curing.

Based on this, UV curing processing may be further selectively performed on a specific location of the adhesive layer 60, so that stickiness at the specific location is large, and stickiness at other locations is small. For example, it can be learned from the foregoing description that in the process of performing S102, an intersection 300 is stuck to a location at which a micro LED chip 101 in the motherboard 21 is located. Therefore, the UV curing may be performed on a location that is at the adhesive layer 60 and that corresponds to an intersection 300, to enhance stickiness of the adhesive layer 60 in this part. In this case, stickiness of other parts at the adhesive layer 60 is weak, to facilitate removal of the adhesive layer 60 in a following process.

In addition, the foregoing description is provided by using an example in which the surface of the side on which the first cloth layer 31 at the stretchable layer 30 is located is stuck to a location of a micro LED chip 101 in the motherboard 21. In some other embodiments of this application, a surface of a side on which the second cloth layer 32 is located may also be stuck to a location of a micro LED chip 101 in the motherboard 21. A sticking process is the same as that described above. Details are not described herein again.

S103: Separating a plurality of micro LED chips 101, where the plurality of separated micro LED chips 101 are separately connected to the first fiber and 301 the second fiber 302.

Figure 13:
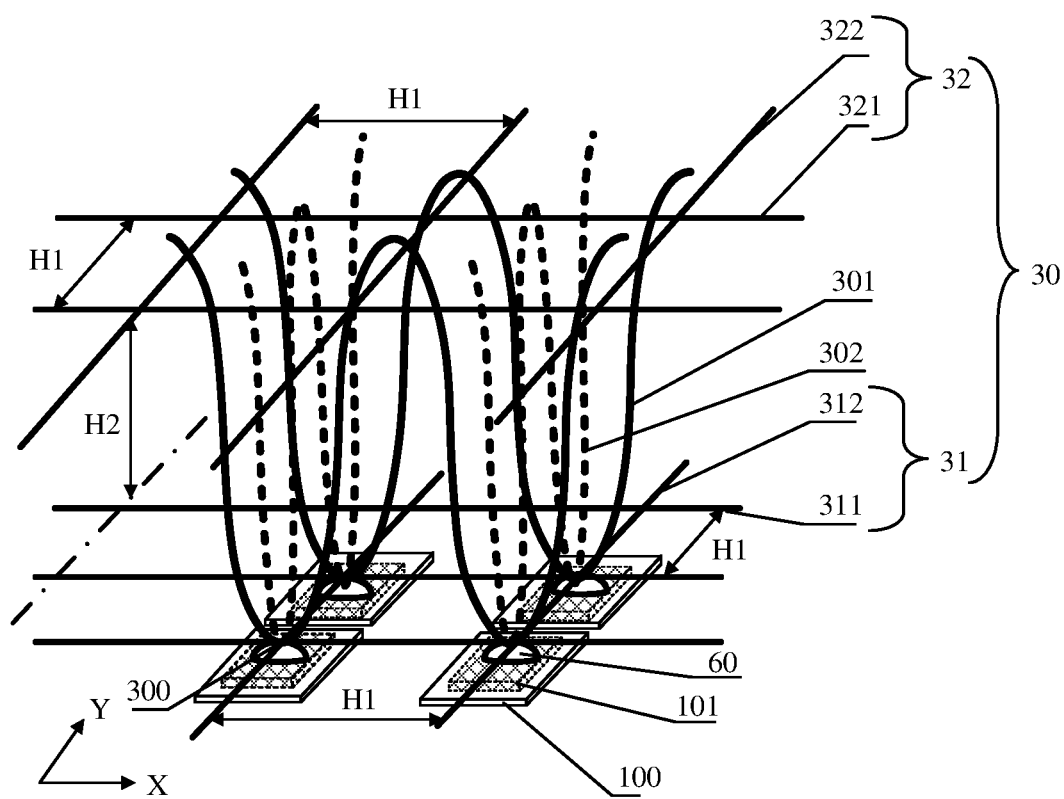
FIG. 13 is a schematic diagram of cutting a motherboard stuck to a stretchable layer according to an embodiment of this application.

Specifically, in an embodiment of this application, when the motherboard 21 is a wafer, in a process of performing S1o3, as shown in FIG. 13, a laser cutting process may be used to cut the substrate 100 of the motherboard 21, to separate a plurality of micro LED chips 101. Alternatively, in some other embodiments of this application, when the motherboard 21 is a carrier board configured to carry the micro LED chips 101, a plurality of micro LED chips 101 may be detached from the carrier board in the process of performing S103.

After S103 is performed, a part that is at the first cloth layer 31 and that is located between two adjacent intersections 300 may be removed.

Figure 14A:
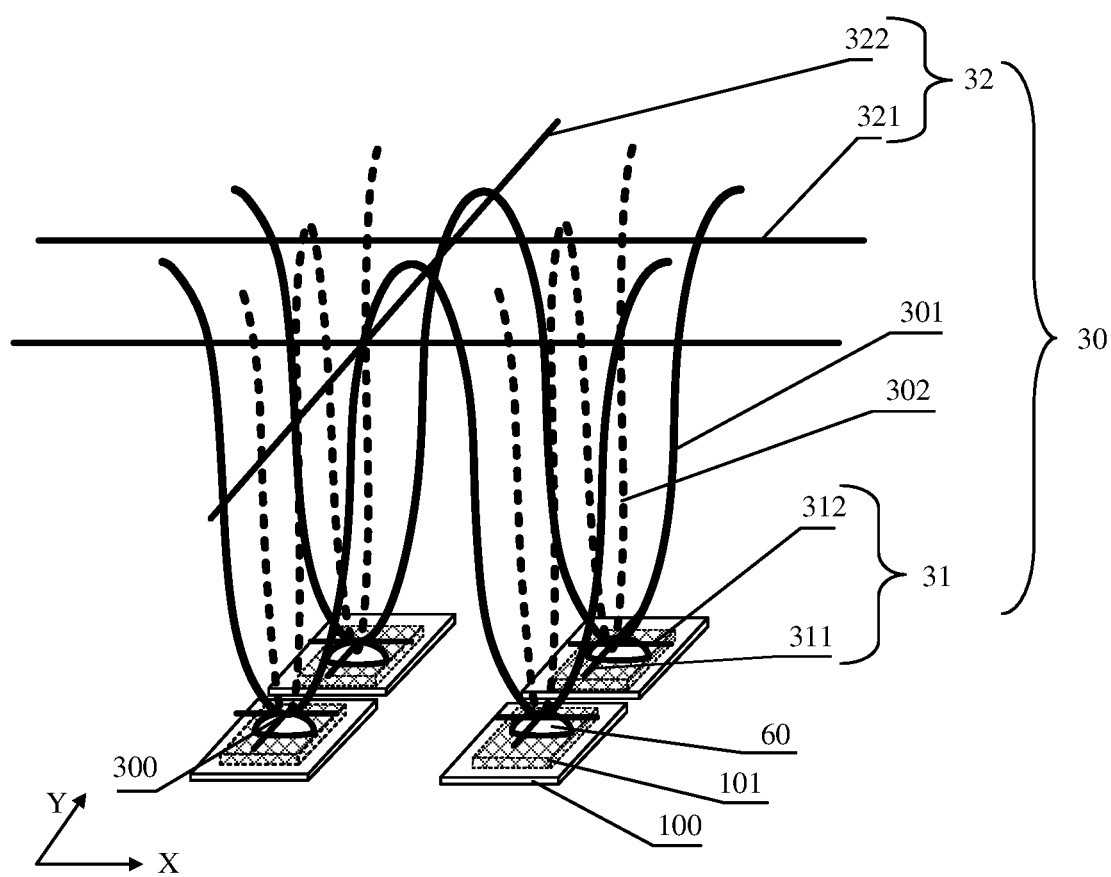
FIG. 14A is a schematic diagram of a structure obtained after a part of the first cloth layer in FIG. 13 is cut.

For example, in some embodiments of this application, S103 may specifically include that, as shown in FIG. 14A, by using a laser, a part that is in the first warp thread 312 and that is located between two adjacent intersections 300, and a part that is in the first weft thread 311 and that is located between two adjacent intersections of the first fiber 301 and the second fiber 302 are first cut.

For example, the laser may be used to focus the part that is in the first warp thread 312 and that is located between two adjacent intersections 300, and the part that is in the first weft thread 311 and that is located between two adjacent intersections 300, so that the parts can be cut off under the action of the laser, and other parts of the stretchable layer 30 are not cut off.

Alternatively, a material of the first cloth layer 31 may be different from materials of the first fiber 301 and the second fiber 302. For example, the material of the first cloth layer 31 may absorb energy emitted by the laser, so that sublimation or melting occurs under the action of the energy, and at the first cloth layer 31, the part that is in the first warp thread 312 and that is located between two adjacent intersections 300, and the part of that is in the first weft thread 311 and that is located between two adjacent intersections 300 are cut off. However, the materials of the first fiber 301 and the second fiber 302 can transmit the laser, and avoid absorbing the energy of the laser, so that the first fiber 301 and the second fiber 302 are not cut off under the laser irradiation.

Figure 14B:
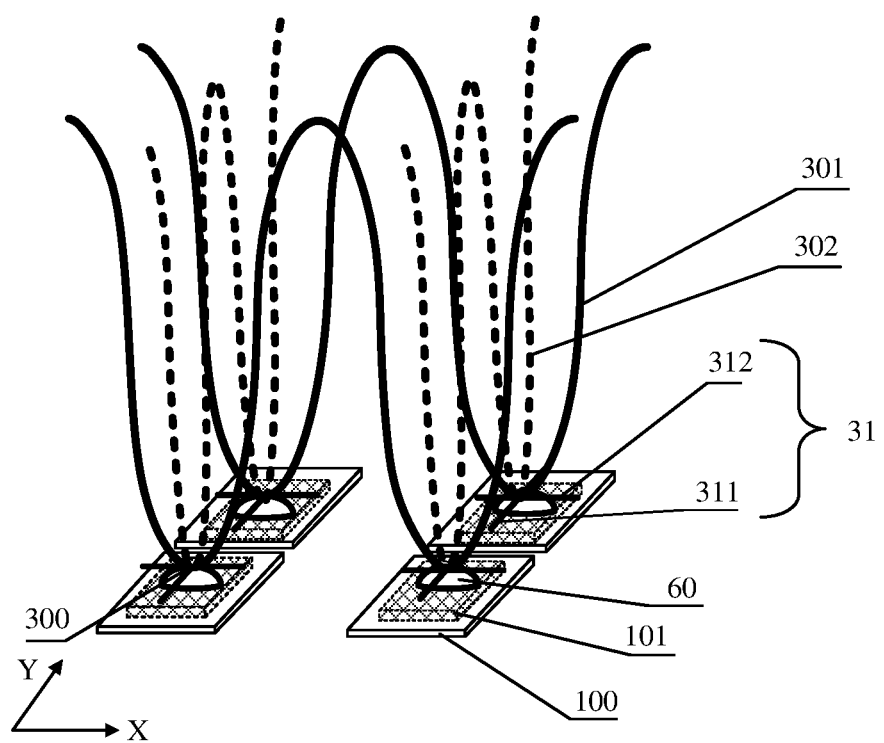
FIG. 14B is a schematic diagram of a structure obtained after the second cloth layer in FIG. 14A is removed.

Next, because the second cloth layer 32 is not stuck to the adhesive layer 60, the second warp thread 322 and the second weft thread 321 may be directly extracted to form a structure shown in FIG. 14B, and in FIG. 14B, the first fiber 301, the second fiber 302, and some materials at the first cloth layer 31 are left. In this case, the second cloth layer 32 may be completely removed. Alternatively, when the first cloth layer 31 is cut by using the laser, at the second cloth layer 32, a part that is in the second warp thread 322 and that is located between two adjacent intersections 300, and a part that is in the second weft thread 321 and that is located between two adjacent intersections 300 may be cut off. In this way, the foregoing step of extracting the second warp thread 322 and the second weft thread 321 does not need to be performed.

Alternatively, in some other embodiments of this application, materials of the first warp thread 312 and the first weft thread 311, and the second warp thread 322 and the second weft thread 321 may include a first material. The materials of the first fiber 301 and the second fiber 302 may include a second material. The first material and the second material are different.

Figure 15:
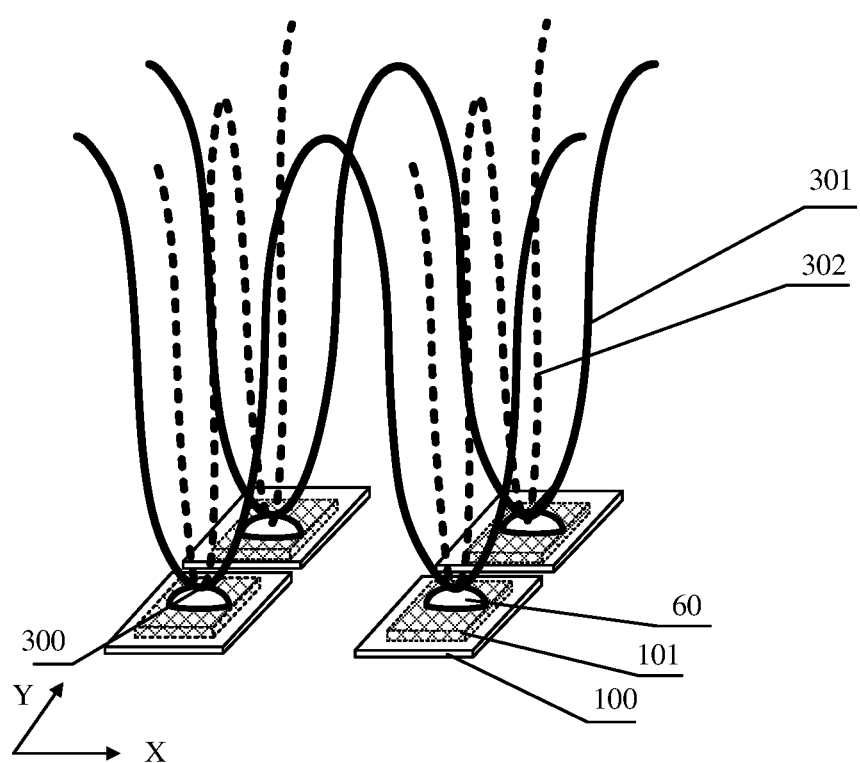
FIG. 15 is another schematic diagram of a structure obtained after the second cloth layer in FIG. 14A is removed.

In this case, S103 may specifically include that the stretchable layer 30 stuck to the micro LED chips 101 is placed into a first solvent used to dissolve the first material. In this way, under the action of the first solvent, the materials of the first warp thread 312 and the first weft thread 311, and the second warp thread 322 and the second weft thread 321 that are formed by the first material may be dissolved, but the first fiber 301 and the second fiber 302 that are made of the second material may be insoluble in the first solvent. In this way, a structure shown in FIG. 15 may be formed, and the first fiber 301 and the second fiber 302 are left in FIG. 15. In this case, the first cloth layer 31 and the second cloth layer 32 may be completely or approximately completely removed.

Manners in which the first material, the second material, and the first solvent are disposed are described below.

For example, the first material that forms the materials of the first warp thread 312 and the first weft thread 311, and the second warp thread 322 and the second weft thread 321 may be cotton, and the second material that forms the first fiber 301 and the second fiber 302 may be wool. In addition, the first solvent may be sulfuric acid with a concentration of 75% and a temperature of 24° C. In this way, the cotton can be dissolved in the first solvent, but the wool cannot be dissolved in the first solvent, to remove the first cloth layer 31 and the second cloth layer 32, and retain the first fiber 301 and the second fiber 302.

Alternatively, for another example, the first material that forms the materials of the first warp thread 312 and the first weft thread 311, and the second warp thread 322 and the second weft thread 321 may be acetate fiber, and the second material that forms the first fiber 301 and the second fiber 302 may be polyester. In addition, the first solvent may be acetic acid glacial with a temperature of 24° C. In this way, the acetate fiber can be dissolved in the first solvent, but the polyester cannot be dissolved in the first solvent, to remove the first cloth layer 31 and the second cloth layer 32, and retain the first fiber 301 and the second fiber 302.

Alternatively, for another example, the first material that forms the materials of the first warp thread 312 and the first weft thread 311, and the second warp thread 322 and the second weft thread 321 may be cotton fiber, and the second material that forms the first fiber 301 and the second fiber 302 may be acrylic fiber. In addition, the first solvent may be alpha hydroxy acids with a concentration of 75% and a temperature of 24° C. In this way, the cotton fiber can be dissolved in the first solvent, but the acrylic fiber cannot be dissolved in the first solvent, to remove the first cloth layer 31 and the second cloth layer 32, and retain the first fiber 301 and the second fiber 302.

It should be noted that the foregoing describes merely an example of the manners in which the first material, the second material, and the first solvent are disposed, and other examples are not described herein.

Alternatively, in some other embodiments of this application, compared with the first fiber 301 and the second fiber 302, the first warp thread 312 and the first weft thread 311, and the second warp thread 322 and the second weft thread 321 may easily break in a stretched state. In this way, in a process of stretching the stretchable layer 30, the first warp thread 312 and the first weft thread 311, and the second warp thread 322 and the second weft thread 321 break, to remove the part between two adjacent intersections 300 at the first cloth layer 31.

Figure 16:
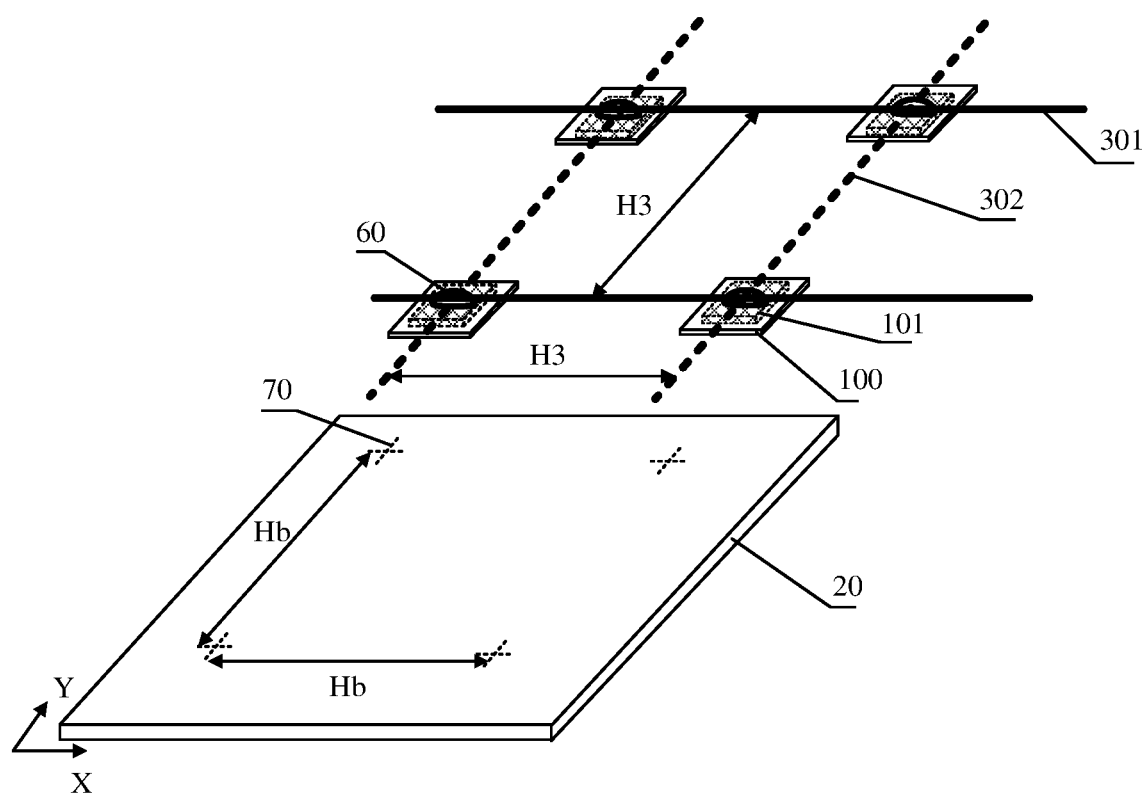
FIG. 16 is a schematic diagram of a structure obtained after the first fiber and the second fiber shown in FIG. 15 are stretched.

Based on this, in some embodiments of this application, the chip transfer method may further include that, as shown in FIG. 16, the first fiber 301 and the second fiber 302 are stretched, and a third spacing H3 is controlled to exist between two adjacent micro LED chips 101 on the first fiber 301 and the second fiber 302. The welding spacing Hb exists between two adjacent preset locations 70 on the substrate 20, and H3=Hb.

It can be learned from the foregoing description that, before the first cloth layer 31 and the second cloth layer 32 are removed, the second spacing H2 (as shown in FIG. 13) exists between the first cloth layer 31 and the second cloth layer 32, and the second spacing H2 and the welding spacing Hb may meet the condition that H2=Hb/2. Therefore, before the first fiber 301 and the second fiber 302 are stretched, the first fiber 301 and the second fiber 302 are wavy, and a height of the wavy arch is the second spacing H2.

Based on this, after the first fiber 301 and the second fiber 302 are stretched, in a stretching process of the first fiber 301 and the second fiber 302, the first fiber 301 and the second fiber 302 change from a wavy shape to a linear shape. When elastic deformation amounts of the first fiber 301 and the second fiber 302 are small, the third spacing H3 between two adjacent micro LED chips 101 on the first fiber 301 and the second fiber 302 may be approximately the same as twice of the second spacing H2. In this way, after the first fiber 301 and the second fiber 302 are stretched, the third spacing H3 between two adjacent micro LED chips 101 on the first fiber 301 and the second fiber 302 is the same or approximately the same as the welding spacing Hb between two adjacent preset locations 70 on the substrate 20.

It should be noted that, for ease of description, in the following embodiments of this application, an example in which after the first fiber 301 and the second fiber 302 are stretched, a distance between two adjacent micro LED chips 101 on the first fiber 301 and the second fiber 302 in the horizontal direction (the first direction X) or the vertical direction (the second direction Y) is the third spacing H3, and a spacing between any adjacent preset locations on the substrate 20 in the horizontal direction or the vertical direction is the welding spacing Hb is used below for description.

In addition, the preset location 70 may not be a mark that actually exists on the substrate 20 and can be identified by human eyes. The preset location 70 may be a location that is stored in a chip welding device based on a requirement and that is used when the micro LED chip 101 is welded. The location may be obtained by using the CCD to collect the alignment mark on the substrate 20.

Figure 17A:
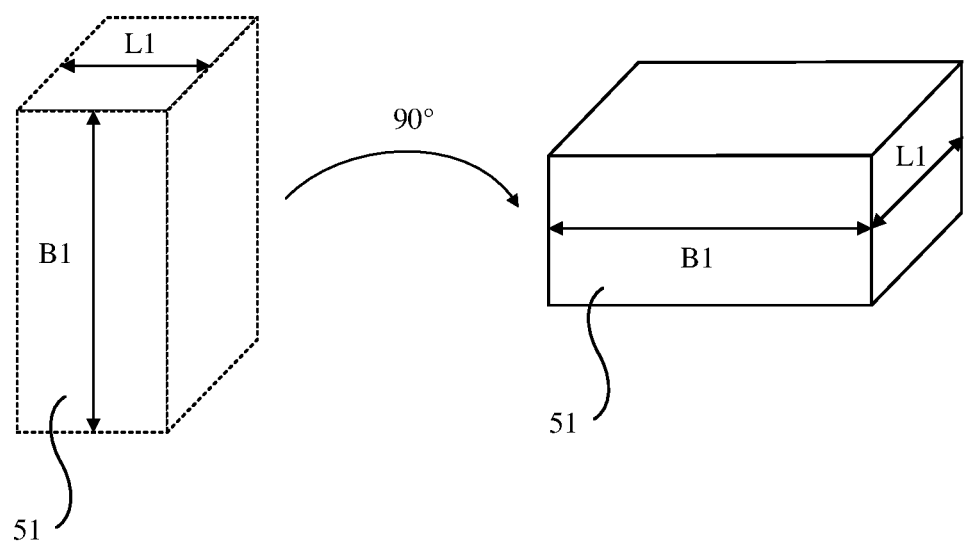
FIG. 17A is a schematic diagram of turning over a first locating pin according to an embodiment of this application.
Figure 17B:
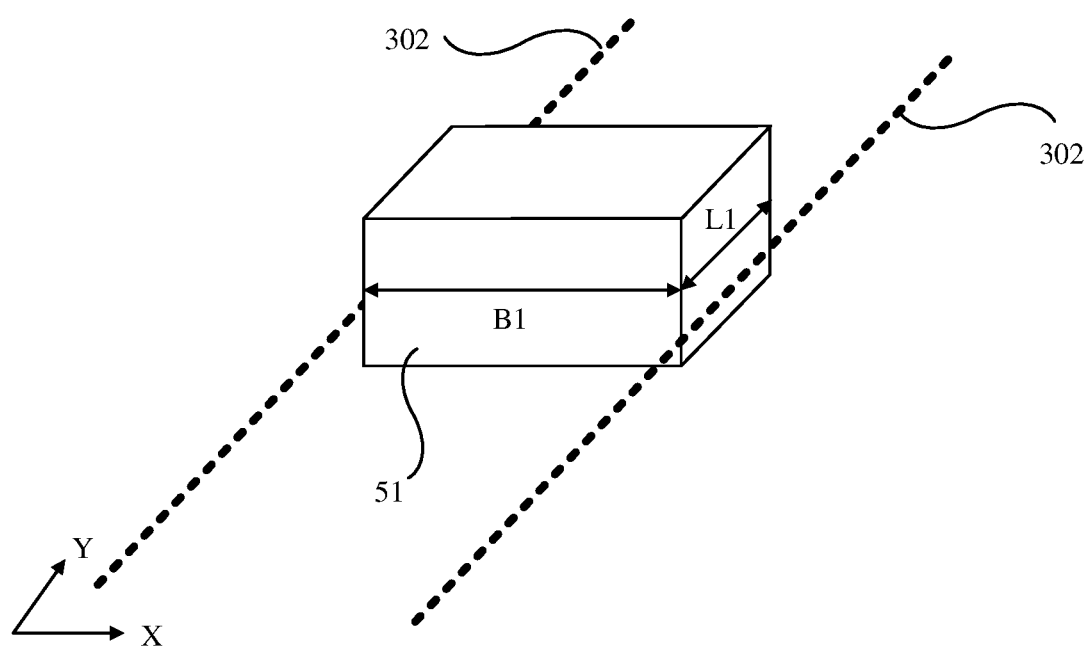
FIG. 17B is a schematic diagram of locating a second fiber by using the first locating pin shown in FIG. 17A.

In some embodiments of this application, performing the stretching of the first fiber 301 and the second fiber 302 may specifically include that the first fiber 301 and the second fiber 302 are first stretched by using the robotic arm, to expand a spacing between two adjacent micro LED chips 101. Then, a plurality of first locating pins 41 are turned over by 90° as shown in FIG. 17A. It can be learned from the foregoing description that the first locating pin 41 is originally disposed between two adjacent first warp threads 312, and both the first warp thread 312 and the stretched second fiber 302 are disposed in the second direction Y. Therefore, after the first warp thread 312 is removed, as shown in FIG. 17B, each first locating pin 41 that turns over by 90° may be disposed between every two adjacent second fibers 302 and in contact with two adjacent second fibers 302. The first locating pin 41 has a first geometric width B1, and B1=H3.

In this way, because the first locating pin 41 is disposed between two adjacent second fibers 302 and in contact with two adjacent second fibers 302, a spacing between two adjacent second fibers 302 can be controlled by setting the first geometric width B1 of the first locating pin 41, so that the spacing between two adjacent second fibers 302 is the same as the third spacing H3.

Figure 18:
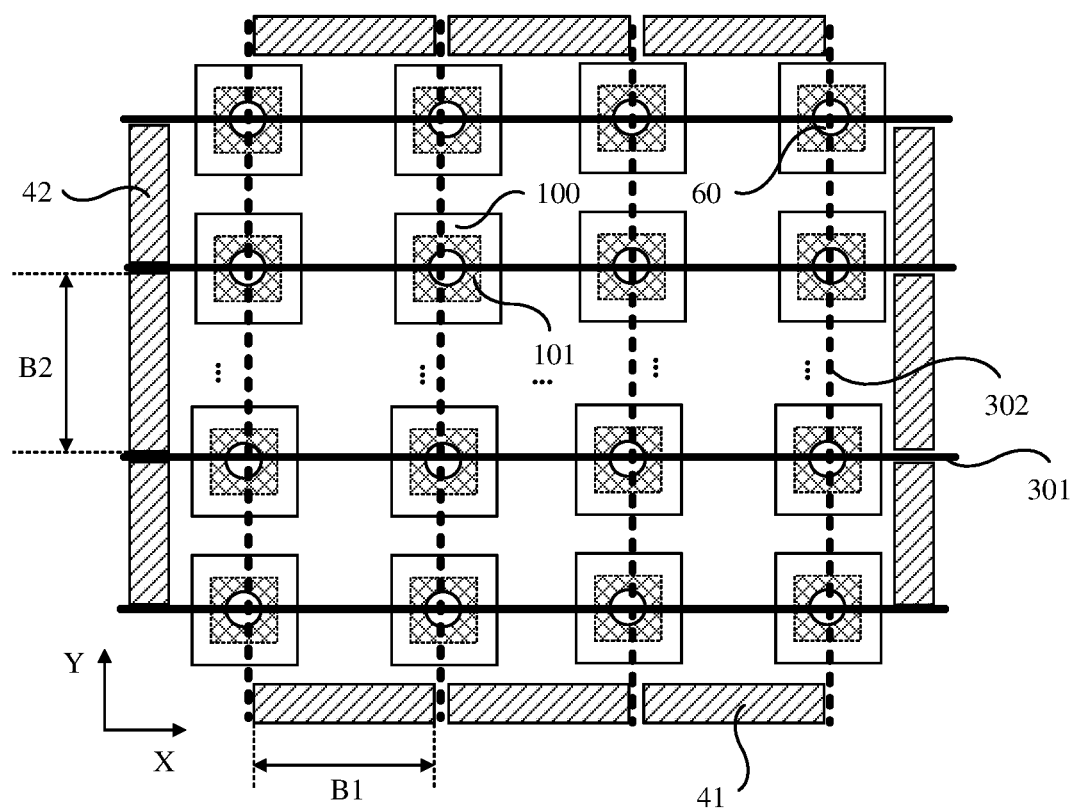
FIG. 18 is a schematic diagram of locating a stretched first fiber and second fiber according to an embodiment of this application.

Next, similarly, a plurality of second locating pins 42 are turned over by 90°. It can be learned from the foregoing description that, as shown in FIG. 6A, the second locating pin 42 is originally disposed between two adjacent first weft threads 311, and both the first weft thread 311 and the stretched first fiber 301 are disposed in the first direction X. Therefore, after the first weft thread 311 is removed, as shown in FIG. 18, each second locating pin 42 that turns over by 90° may be disposed between two adjacent first fibers 301 and in contact with two adjacent first fibers 301. The second locating pin 42 has a second geometric width B2, and B2=H3.

The first geometric width B1 of the first locating pin 41 refers to a distance between two opposite sides of the first locating pin 41 in a direction perpendicular to the second fiber 302, for example, the first direction X. Similarly, the second geometric width B2 of the second locating pin 42 refers to a distance between two opposite sides of the second locating pin 42 in a direction perpendicular to the first fiber 301, for example, the second direction Y.

Figure 19:
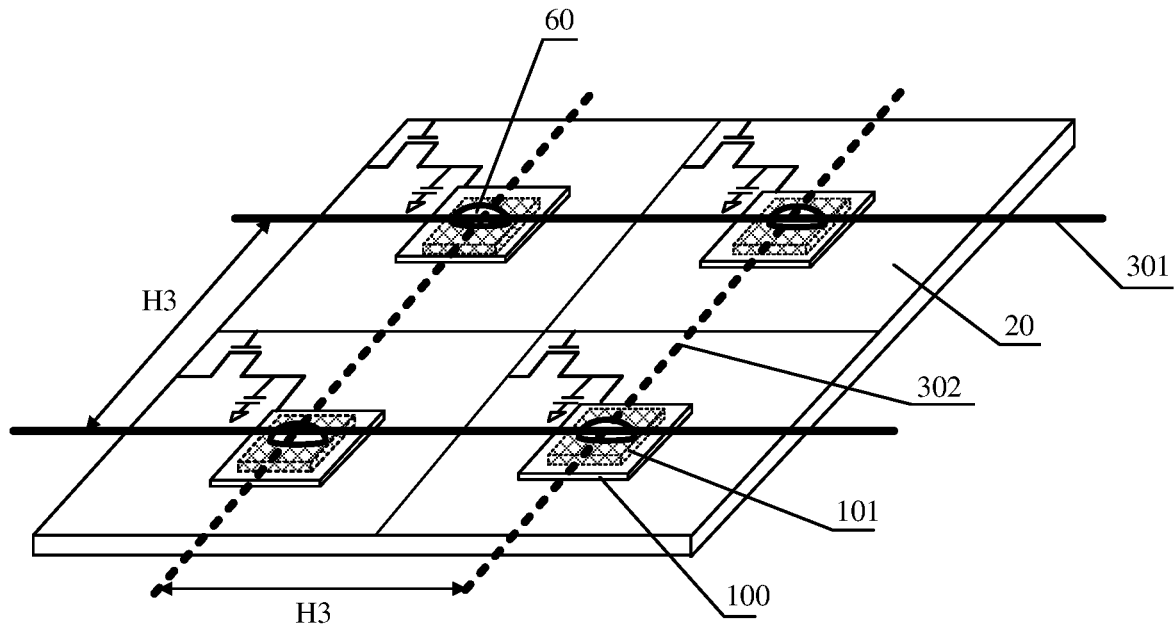
FIG. 19 is a schematic diagram of a structure in which a chip on a stretched first fiber and second fiber is welded to a substrate.

It should be noted that the foregoing description is provided by using an example in which the spacing between any two adjacent micro LED chips 101 welded to the substrate 20 is the same as the third spacing H3 (as shown in FIG. 19). In some other embodiments of this application, the spacing between two adjacent micro LED chips 101 welded to the substrate 20 may alternatively be different. In this case, the first geometric width B1 of the first locating pin 41 and the second geometric width B2 of the second locating pin 42 may be set based on a spacing requirement, to meet a different spacing requirement of two adjacent micro LED chips 101.

It can be learned from the foregoing description that, by using the first locating pin 41, the first spacing H1 between two adjacent first warp threads 312 may be controlled, and the third spacing H3 between two adjacent second fibers 302 may be further controlled. By using the second locating pin 42, the first spacing H1 between two adjacent first weft threads 311 may be controlled, and the third spacing H3 between two adjacent first fibers 301 may be further controlled. In this way, there is no need to additionally add a locating pin when locating the first fiber 301 and the second fiber 302, so that a quantity of locating pins can be reduced, and a locating process can be simplified.

S104: As shown in FIG. 19, separately dispose a plurality of micro LED chips 101 stuck to the stretchable layer 30 at a plurality of preset locations 70 of the substrate 20 (as shown in FIG. 16).

Figure 20:
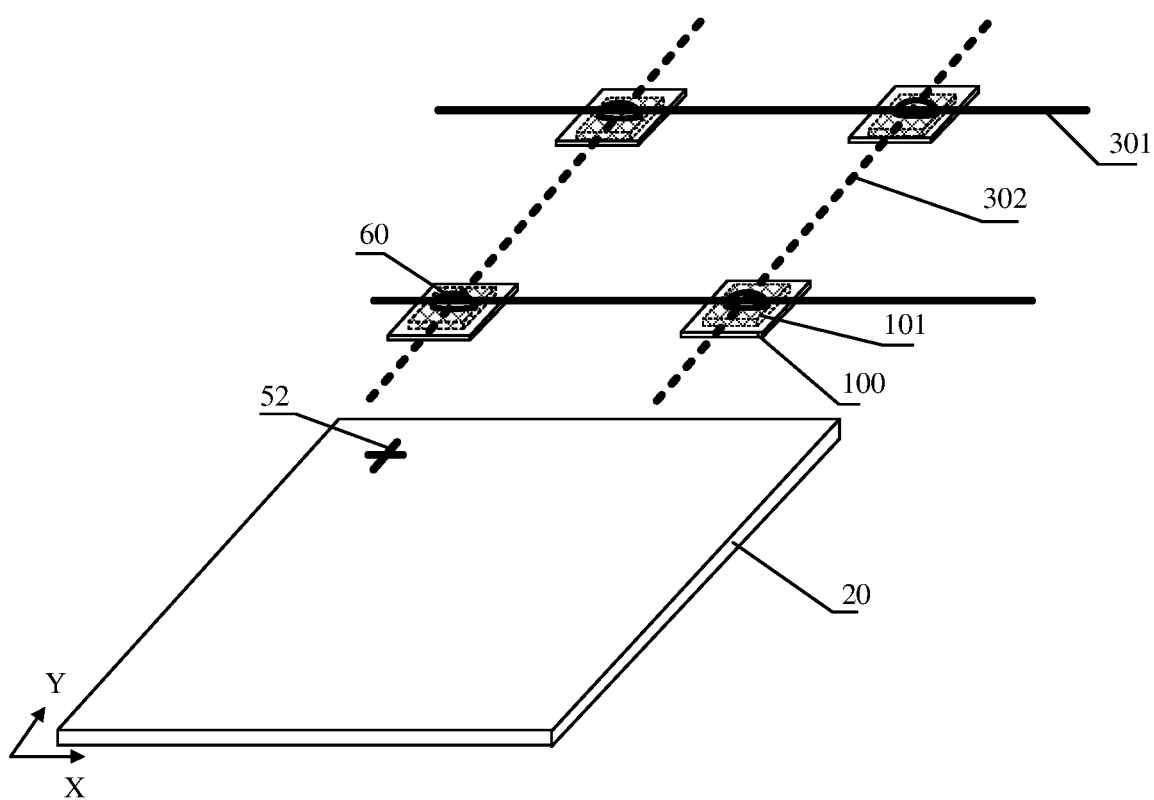
FIG. 20 is a schematic diagram of aligning a stretched first fiber and second fiber with a substrate.

To ensure that each micro LED chip 101 is in a one-to-one correspondence with a preset location of the substrate 20 in a process of performing S104, before performing S104, the micro LED chip 101 may be aligned with the preset location 70 (as shown in FIG. 16) of the substrate 20. Specifically, as shown in FIG. 20, at least one second alignment mark 52 may be manufactured on the substrate 20. A manufacturing method of the second alignment mark 52 is similar to the manufacturing method of the first alignment mark 51, and details are not described herein again.

Next, the CCD may be used to obtain locations of the second alignment mark 52 and the micro LED chip 101 on the first fiber 301 and the second fiber 302. A processor (not shown in the figure) may control, based on a collection result of the CCD by using the robotic arm, a location of a micro LED chip 101 on the first fiber 301 and the second fiber 302 to overlap a location of a second alignment mark 52, to align the micro LED chip 101 with the preset location 70 of the substrate 20.

Figure 21:
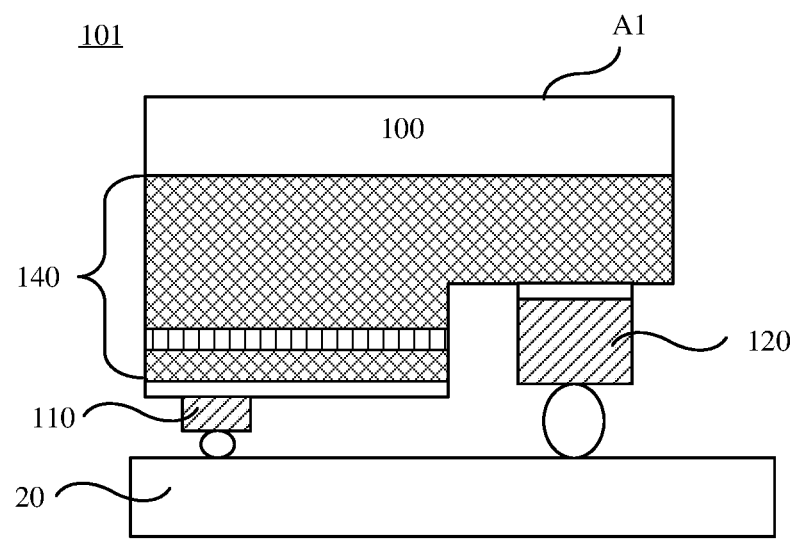
FIG. 21 is a schematic diagram of a chip flip structure according to an embodiment of this application.

It can be learned from the foregoing description that, in some embodiments of this application, as shown in FIG. 11C, the first fiber 301 and the second fiber 302 may be stuck on the surface A1 of the substrate 100, and the micro LED chip 101 is disposed on the surface A2 of the substrate 100. The surface A1 and the surface A2 are disposed opposite to each other. In this way, after S104 is performed, as shown in FIG. 21, a micro LED chip 101 may be welded to a preset location 70 (as shown in FIG. 16) on the substrate 20 by using a flip-chip process. In this case, the first electrode 110 and the second electrode 120 of the micro LED chip 101 are disposed close to the substrate 20, so that the first electrode 110 and the second electrode 120 of the micro LED chip 101 can be directly welded to the substrate 20, and are electrically connected to the pixel drive circuit 201 (as shown in FIG. 1D) on the substrate 20. In this way, transmission efficiency of an electrical signal provided by a circuit on the substrate 20 to the first electrode 110 and the second electrode 120 of the micro LED chip 101 can be improved.

It should be noted that different types of the substrate 20 correspond to different technologies for packaging the micro LED chip 101 by using the flip-chip process. For example, when the substrate 20 is a PCB, a technology of packaging the micro LED chip 101 by using the flip-chip process may be referred to as a chip on board (chip on board, COB) packaging technology. Alternatively, when a substrate that is in the substrate 20 and that is configured to carry the pixel drive circuit 201 is a glass substrate, a technology of packaging the micro LED chip 101 by using the flip-chip process may be referred to as a chip on glass (chip on glass, COG) packaging technology. Alternatively, when a substrate that is in the substrate 20 and that is configured to carry the pixel drive circuit 201 is a plastic substrate, a technology of packaging the micro LED chip 101 by using the flip-chip process may be referred to as a chip on plastic (chip on plastic, COP) packaging technology.

Alternatively, in some embodiments of this application, as shown in FIG. 12C, the first fiber 301, the second fiber 302, and the micro LED chip 101 are all located on the side on which the surface A2 of the substrate 100 is located. In this case, the first electrode 110 and the second electrode 120 of the micro LED chip 101 are disposed away from the substrate 20, and a via (not shown in the figure) that penetrates the epitaxial layer 140 may be manufactured on the micro LED chip 101, so that the first electrode 110 and the second electrode 120 are welded to the substrate 20 through different vias.

S105: Remove the first fiber 301 and the second fiber 302.

Figure 22:
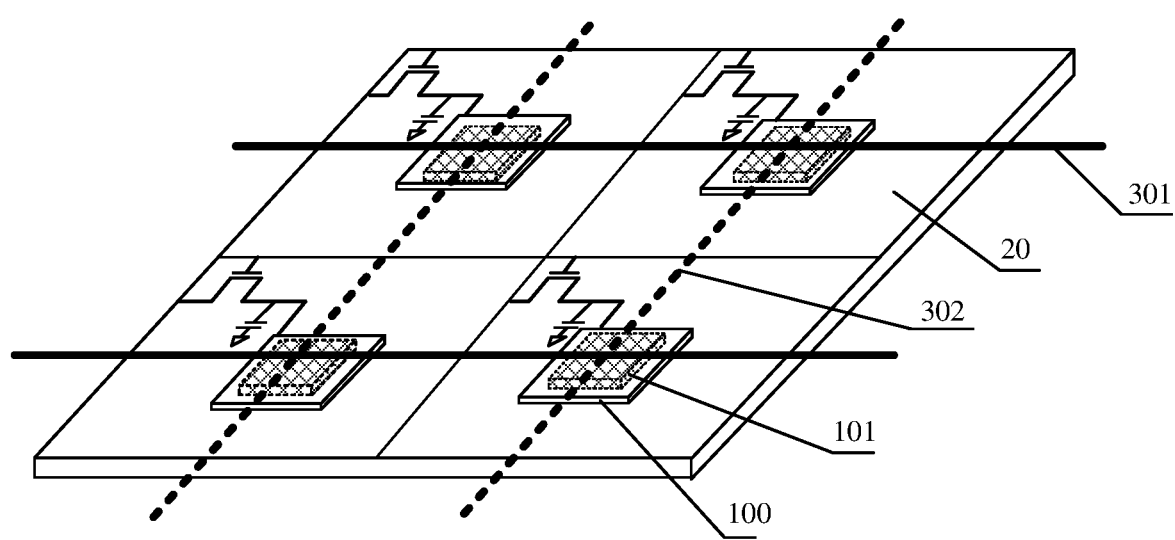
FIG. 22 is a schematic diagram of a structure obtained after the adhesive layer in FIG. 20 is removed.

Specifically, first, a laser lift off (laser lift off, LLO) process may be used to irradiate the adhesive layer 60, to release the stickiness of the adhesive layer 60, so that the adhesive layer 60 is separated from the micro LED chip 101. In this case, as shown in FIG. 22, the first fiber 301 and the second fiber 302 are placed only above the micro LED chip 101, and are not stuck to the micro LED chip 101. Next, the first fiber 301 and the second fiber 302 are removed, to remove the first fiber 301 and the second fiber 302.

Figure 23:
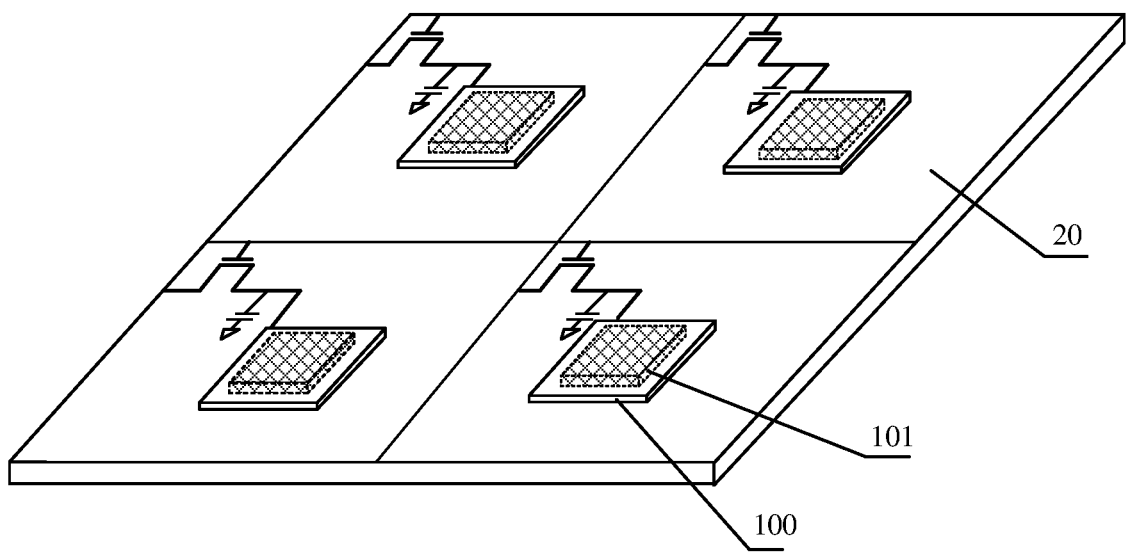
FIG. 23 is a schematic diagram of a structure obtained after the first fiber and the second fiber shown in FIG. 22 are removed.

Then, the substrate 20 (that is, a micro LED panel) welded with the micro LED chip 101 shown in FIG. 23 may be cleaned, to complete a mass transfer process of the micro LED chip 101.

In conclusion, in the chip transfer method provided in embodiments of this application, the stretchable layer 30 existing before stretching may be stuck to each micro LED chip 101 in the motherboard 21. As shown in FIG. 7, the second spacing H2 exists between the first cloth layer 31 and the second cloth layer 32. In this case, the second spacing H2 exists between the second warp thread 322 and the second weft thread 321 at the second cloth layer 32 and the first cloth layer 31. Because the first fiber 301 intersects with the second warp thread 322, and the second fiber 302 intersects with the second weft thread 321, the first fiber 301 and the second fiber 302 at the stretchable layer 30 existing before stretching can be wavy.

In addition, at the stretchable layer 30, the first weft thread 311 and the first warp thread 312 that intersect at the first cloth layer 31, and the second weft thread 321 and the second warp thread 322 that intersect at the second cloth layer 32 can control the first spacing H1 between two adjacent intersections of the first fiber 301 and the second fiber 302 that intersect at the first cloth layer 31 and the second cloth layer 32. Therefore, the first spacing H1 can be the same as the initial spacing Ha between two adjacent micro LED chips 101 in the motherboard 21. In this case, after the stretchable layer 30 existing before stretching is stuck to each micro LED chip 101 in the motherboard 21, an intersection 300 is stuck to a location at which a micro LED chip 101 in the motherboard 21 is located.

On this basis, after the stretchable layer 30 existing before stretching is stuck to the motherboard 21, the substrate of the motherboard 21 may be cut, and the first cloth layer 31 and the second cloth layer 32 are removed. Next, as shown in FIG. 16, the first fiber 301 and the second fiber 302 at the stretchable layer 30 are stretched, and a spacing between two adjacent micro LED chips 101 on the first fiber 301 and the second fiber 302 is expanded, so that a spacing between two adjacent micro LED chips 101 changes from the original first spacing H1 to the third spacing H3. The third spacing H3 is the same as the welding spacing Hb between two adjacent preset locations 70 on the substrate 20. Based on this, the micro LED chips 101 located on the stretched first fiber 301 and the stretched second fiber 302 may be welded to the preset locations 70 on the substrate 20 one by one. Then, the first fiber 301 and the second fiber 302 are removed, and the formed micro LED chip 101 is cleaned, to complete the mass transfer of the micro LED chip 101.

It can be learned from the foregoing descriptions that, in the chip transfer method provided in this application, only the stretchable layer 30 that is not stretched needs to be stuck to each micro LED chip 101 in the motherboard 21. Then, the stretchable layer 30 is stretched to expand a spacing between two adjacent micro LED chips 101 at the stretchable layer 30, so that a spacing between two adjacent micro LED chips 101 matches a spacing between adjacent preset locations 70 on the substrate 20. In this way, most or even all micro LED chips 101 in a same motherboard 21 can be transferred to the substrate 20 at a time. Therefore, in a mass transfer process of the chips, a transfer head does not need to reciprocate between the substrate 20 and the motherboard 21 used as a donor substrate, to improve mass transfer efficiency of the chips.

In addition, in a solution provided in a related technology, an entire thin film with a same material and uniform texture may be used. Before the thin film is stretched, micro LED chips on a motherboard are stuck, and then the micro LED chips are bound to a circuit board after the thin film is stretched. In this solution, because a deformation amount of the thin film is determined by the material forming the thin film, and the thin film is formed by using the same material, deformation amounts throughout the thin film before and after the stretching are basically the same. Therefore, displacement amounts of the micro LED chips at any location on the thin film are basically the same before and after the thin film is stretched. However, according to the chip transfer method provided in this application, the first spacing H1 between any two adjacent intersections in the first fiber 301 and the second fiber 302 and the height of the wavy arch (that is, the second spacing H2 between the first cloth layer 31 and the second cloth layer 32) of the first fiber 301 and the second fiber 302 existing before stretching may be controlled based on a requirement, so that different requirements on initial locations of some micro LED chips 101 in the motherboard 21, and different requirements on binding locations of some micro LED chips 101 on the substrate 20 can be met, and an application scope is wider.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A method, comprising:
    forming a stretchable layer by:
        intersecting a plurality of first warp threads and a plurality of first weft threads to form a first cloth layer, wherein a spacing between two adjacent first warp threads is a first spacing H1, and a spacing between two adjacent first weft threads is the first spacing H1; and
    intersecting a plurality of second warp threads and a plurality of second weft threads to form a second cloth layer, wherein a spacing between two adjacent second warp threads is the first spacing H1, a spacing between two adjacent second weft threads is the first spacing H1, a vertical projection of each second warp thread at the first cloth layer is located between two adjacent first warp threads, and a vertical projection of each second weft thread at the first cloth layer is located between two adjacent second weft threads, and wherein the stretchable layer comprises a plurality of first fibers, a plurality of second fibers, the first cloth layer, and the second cloth layer, wherein the first cloth layer and the second cloth layer are disposed in a stacked manner, the plurality of first fibers and the plurality of second fibers intersect between the first cloth layer and the second cloth layer in a manner that a plurality of intersections are between the plurality of first fibers and the plurality of second fibers, wherein the first spacing H1 is between two adjacent intersections of the plurality of intersections, and a second spacing H2 is between the first cloth layer and the second cloth layer, and wherein the first cloth layer is closer to a plurality of chips than the second cloth layer;
    sticking the stretchable layer to the plurality of chips;
    separating the plurality of chips, wherein the plurality of separated chips are separately connected to the plurality of first fibers and the plurality of second fibers after the plurality of chips are separated;
    respectively disposing, at a plurality of preset locations of a substrate, the plurality of chips stuck to the stretchable layer; and
    removing the plurality of first fibers and the plurality of second fibers.

2. The method according to claim 1, wherein:
    the plurality of first fibers intersects with the plurality of first warp threads and the plurality of second warp threads; and
    the plurality of second fibers intersect with the plurality of first weft threads and the plurality of second weft threads.

3. The method according to claim 1, wherein sticking the stretchable layer to the plurality of chips comprises:
    sticking an intersection of the plurality of intersections to a chip of the plurality of chips in a motherboard in alignment.

4. The method according to claim 3, wherein an initial spacing Ha is between two adjacent chips of the plurality of chips in the motherboard, and Ha=H1.

5. The method according to claim 3, wherein sticking the intersection of the plurality of intersections to the chip of the plurality of chips in the motherboard in alignment comprises:
    coating an adhesive layer at the intersection of the plurality of intersections at the first cloth layer; and
    sticking a surface of a side of the stretchable layer coated with an adhesive layer to the motherboard in a manner that a vertical projection of the intersection of the plurality of intersections on the motherboard overlaps the chip of the plurality of chips in the motherboard.

6. The method according to claim 3, wherein sticking the intersection of the plurality of intersections to the chip of the plurality of chips in the motherboard in alignment comprises:

dispensing adhesive on the motherboard to form a plurality of adhesive layers, wherein a vertical projection of an adhesive layer of the plurality of adhesive layers on the motherboard overlaps the chip of the plurality of chips in the motherboard; and sticking, to the motherboard through the plurality of adhesive layers, a surface of the stretchable layer on a side on which the first cloth layer is located, so that a vertical projection of an intersection of the plurality of intersections on the motherboard overlaps the adhesive layer of the plurality of adhesive layers.

7. The method according to claim 3, wherein sticking the intersection of the plurality of intersections to the chip of the plurality of chips in the motherboard in alignment comprises:

coating a colloidal material layer on the motherboard, and patterning the colloidal material layer in a manner that a plurality of adhesive layers are formed on the motherboard, wherein a vertical projection of an adhesive layer of the plurality of adhesive layers on the motherboard overlaps the chip of the plurality of chips in the motherboard; and sticking, to the motherboard through the adhesive layer of the plurality of adhesive layers, a surface of a side of the stretchable layer on which the first cloth layer is located, in a manner that a vertical projection of the intersection of the plurality of intersections on the motherboard overlaps the adhesive layer of the plurality of adhesive layers.

8. The method according to claim 3, wherein the motherboard comprises a motherboard substrate configured to carry the chips, and sticking the stretchable layer to the plurality of chips comprises:

sticking the stretchable layer on a surface of a side of the motherboard that is of the motherboard substrate and faces away from the plurality of chips.

9. The method according to claim 8, wherein the plurality of chips each comprise a first electrode and a second electrode, and respectively disposing, at the plurality of preset locations of the substrate, the plurality of chips stuck to the stretchable layer comprises:

placing, at a preset location of the preset locations of the substrate, by using a flip-chip process, a first electrode and a second electrode of a first chip next to the substrate, and welding the first electrode and the second electrode of the first chip to the substrate.

10. The method according to claim 1, wherein after separating the plurality of chips, and before respectively disposing, at the plurality of preset locations of the substrate, the plurality of chips stuck to the stretchable layer, the method further comprises:

stretching the plurality of first fibers and the plurality of second fibers, so that a third spacing H3 exists between two adjacent chips on the plurality of first fibers and the plurality of second fibers, wherein a welding spacing Hb exists between two adjacent preset locations on the substrate, and H3=Hb.

11. The method according to claim 10, wherein the second spacing H2 and the welding spacing Hb meet a condition that H2=Hb/2.

12. The method according to claim 10, wherein after separating the plurality of chips, and before stretching the first fibers and the second fibers, the method further comprises:

removing a part of a material between two adjacent intersections of the plurality of intersections.

13. The method according to claim 12, wherein materials of the plurality of first warp threads, the plurality of first weft threads, the plurality of second warp threads, and the plurality of second weft threads comprise a first material, materials of the plurality of first fibers and the plurality of second fibers comprise a second material, and the first material and the second material are different materials; and wherein removing the part of the material between the two adjacent intersections comprises:

placing the stretchable layer stuck to the plurality of chips into a first solvent used to dissolve the first material.

14. The method according to claim 12, wherein removing the part of the material between the two adjacent intersections comprises:

cutting, by using a laser, a part that is in the plurality of first warp threads and that is located between the two adjacent intersections, and a part that is in the plurality of first weft threads and that is located between two adjacent intersections.

15. The method according to claim 14, wherein after separating the plurality of chips, and before stretching the plurality of first fibers and the plurality of second fibers, the method further comprises:

removing the plurality of second warp threads and the plurality of second weft threads.

16. The method according to claim 1, wherein the spacing between two adjacent first warp threads being the same as the first spacing H1, and the spacing between two adjacent first weft threads being the same as the first spacing H1 comprises:

disposing a plurality of first locating pins around a motherboard, and disposing a first locating pin of the plurality of first locating pins between every two adjacent first warp threads, wherein the first locating pins are in contact with the corresponding two adjacent first warp threads, each first locating pin has a first geometric length L1, and L1=H1; and disposing a plurality of second locating pins around the motherboard, and disposing a second locating pin between every two adjacent first weft threads, wherein the second locating pins are in contact with the corresponding two adjacent first weft threads, each second locating pin has a second geometric length L2, and L2=H1, wherein a direction of the first geometric length L1 of the first locating pins is perpendicular to each of the corresponding two adjacent first warp threads, and a direction of the second geometric length L2 of each second locating pin is perpendicular to each of the corresponding two adjacent first weft threads.

17. The method according to claim 16, wherein the motherboard comprises a motherboard substrate configured to carry the chips, and the motherboard substrate has a plurality of first alignment marks; and before sticking the stretchable layer to the chips, the method further comprises:

overlapping a first warp thread or a first weft thread at the stretchable layer with at least one first alignment mark.

18. The method according to claim 17, wherein the motherboard substrate has at least one second alignment mark; and before respectively disposing, at the plurality of preset locations of the substrate, the plurality of chips at the stretchable layer, the method further comprises:

controlling a chip of the plurality of chips on the plurality of first fibers and the plurality of second fibers to overlap a second alignment mark of the at least one second alignment mark.

19. The method according to claim 1, further comprising: installing the substrate in an electronic device.

20. A method, comprising:

sticking a stretchable layer to a plurality of chips, wherein the stretchable layer comprises:

a first cloth layer comprising a plurality of first warp threads intersecting a plurality of first weft threads, wherein a spacing between two adjacent first warp threads is a first spacing $H1$, and a spacing between two adjacent first weft threads is the first spacing $H1$; and a second cloth layer comprising a plurality of second warp threads intersecting a plurality of second weft threads, wherein a spacing between two adjacent second warp threads is the first spacing $H1$, a spacing between two adjacent second weft threads is the first spacing $H1$, a vertical projection of each second warp thread at the first cloth layer is located between two adjacent first warp threads, and a vertical projection of each second weft thread at the first cloth layer is located between two adjacent second weft threads;

a plurality of first fibers; and a plurality of second fibers, wherein the first cloth layer and the second cloth layer are disposed in a stacked manner, the plurality of first fibers and the plurality of second fibers intersect between the first cloth layer and the second cloth layer in a manner that a plurality of intersections are between the plurality of first fibers and the plurality of second fibers, wherein the first spacing $H1$ is between two adjacent intersections of the plurality of intersections, and a second spacing $H2$ is between the first cloth layer and the second cloth layer, and wherein the first cloth layer is closer to the plurality of chips than the second cloth layer;

separating the plurality of chips, wherein the plurality of separated chips are separately connected to the plurality of first fibers and the plurality of second fibers after the plurality of chips are separated;

respectively disposing, at a plurality of preset locations of a substrate, the plurality of chips stuck to the stretchable layer; and removing the plurality of first fibers and the plurality of second fibers.

* * * * *